United States Patent
Wetzel et al.

(10) Patent No.: US 12,428,439 B2
(45) Date of Patent: Sep. 30, 2025

(54) LANTHANIDE AND LANTHANIDE-LIKE TRANSITION METAL COMPLEXES

(71) Applicants: Merck Patent GmbH, Darmstadt (DE); Versum Materials US, LLC, Tempe, AZ (US)

(72) Inventors: Christoph Wetzel, Ehingen (DE); Holger Heil, Frankfurt am Main (DE); Michal Krompiec, Southampton (GB); Lars Lietzau, Rossdorf (DE); David Bruge, Frankfurt am Main (DE); Ming Fang, Andover, MA (US); Sergei V. Ivanov, Schnecksville, PA (US)

(73) Assignees: Merck Patent GmbH, Darmstadt (DE); Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 18/251,130

(22) PCT Filed: Nov. 18, 2021

(86) PCT No.: PCT/EP2021/082084
§ 371 (c)(1),
(2) Date: Apr. 28, 2023

(87) PCT Pub. No.: WO2022/106508
PCT Pub. Date: May 27, 2022

(65) Prior Publication Data
US 2024/0400598 A1 Dec. 5, 2024

Related U.S. Application Data

(60) Provisional application No. 63/116,487, filed on Nov. 20, 2020.

(51) Int. Cl.
C07F 17/00 (2006.01)
C23C 16/40 (2006.01)
(Continued)

(52) U.S. Cl.
CPC ............. *C07F 17/00* (2013.01); *C23C 16/40* (2013.01); *C23C 16/4408* (2013.01); *C23C 16/45553* (2013.01)

(58) Field of Classification Search
CPC ..... C07F 17/00; C23C 16/40; C23C 16/4408; C23C 16/45553; C23C 16/45536
See application file for complete search history.

(56) References Cited

U.S. PATENT DOCUMENTS

| | | | |
|---|---|---|---|
| 8,283,201 B2 | 10/2012 | Pallem et al. | |
| 2007/0235821 A1 | 10/2007 | Clark | |

(Continued)

FOREIGN PATENT DOCUMENTS

| | | |
|---|---|---|
| CN | 102057077 A | 5/2011 |
| CN | 102119238 A | 7/2011 |

(Continued)

OTHER PUBLICATIONS

Beer, S. M. et al., "Study on structural and thermal characteristics of heteroleptic yttrium complexes as potential precursors for vapor phase deposition", European Journal of Inorganic Chemistry, vol. 20, No. 37, 2020, pp. 3587-3596.

(Continued)

*Primary Examiner* — Michael G Miller
(74) *Attorney, Agent, or Firm* — William T. Slaven, IV; EMD Performance Materials Corp.

(57) ABSTRACT

The disclosed and claimed subject matter provides precursors having at least one tethered cyclopentadienyl ligand ("Cp ligand"), at least one amidinate ligand ("Ad ligand") and a lanthanide and/or lanthanide-like transition metal ("M") of the general formulae (i) (Cp ligand)$_2$-M-(Ad ligand) or (ii) (Cp ligand)-M-(Ad ligand)$_2$.

25 Claims, 13 Drawing Sheets

(51) Int. Cl.
  *C23C 16/44*   (2006.01)
  *C23C 16/455*  (2006.01)

(56) References Cited

U.S. PATENT DOCUMENTS

| | | | |
|---|---|---|---|
| 2016/0315168 A1 | 10/2016 | Dussarrat et al. | |
| 2017/0008914 A1* | 1/2017 | Park | C07F 17/00 |
| 2018/0155827 A1 | 6/2018 | Yoon et al. | |
| 2019/0017171 A1 | 1/2019 | Kalutarage et al. | |
| 2019/0062916 A1 | 2/2019 | Schmiege et al. | |
| 2019/0152996 A1 | 5/2019 | Park et al. | |

FOREIGN PATENT DOCUMENTS

| | | |
|---|---|---|
| CN | 106336422 A | 1/2017 |
| JP | 2004-527651 A | 9/2004 |
| JP | 2011-522833 A | 8/2011 |
| JP | 2017-019777 A | 1/2017 |
| JP | 2020-504779 A | 2/2020 |
| JP | 2022-551859 A | 12/2022 |
| JP | 2023-508828 A | 3/2023 |
| TW | 201346056 A | 11/2013 |
| WO | 2021/071567 A1 | 4/2021 |
| WO | 2021/133080 A1 | 7/2021 |
| WO | 2022/106508 A1 | 5/2022 |

OTHER PUBLICATIONS

Evans, W. J. et al., "Facile syntheses of unsolvated UI3 and tetramethylcyclopentadienyl uranium halides", Inorganic chemistry, vol. 44, No. 11, Apr. 28, 2005, pp. 3993-4000.

Gu, D. et al., "Lanthanocene and Cerocene Alkyl Complexes: Synthesis, Structure, and Reactivity Studies.", Inorganic Chemistry, vol. 58, No. 14, Jun. 24, 2019, pp. 9260-9269.

Lim, B. S. et al., "Synthesis and characterization of volatile, thermally stable, reactive transition metal amidinates", Inorganic chemistry, vol. 42, No. 24, Oct. 25, 2003, pp. 7951-7958.

International Search Report and Written Opinion received for PCT Application No. PCT/EP2021/082084, mailing date Mar. 14, 2022, 15 Pages.

Wang, B. et al., "Half-sandwich scandium boryl complexes bearing a silylene-linked cyclopentadienyl-amido ligand", Dalton Transactions, vol. 43, No. 38, Jul. 14, 2014, pp. 14215-14218.

Wei, P. H. et al., "Cyclopentadienyl-Like Ligand as a Reactive Site in Half-Sandwich Bis (amidinato) Rare-Earth-Metal Complexes: An Efficient Application in Catalytic Addition of Amines to Carbodiimides", Organometallics, vol. 33, No. 11, May 27, 2014, pp. 2784-2789.

Xu, L. et al., "Half-sandwich bis (propiolamidinate) rare-earth metal complexes: Synthesis, structure and dissociation of the cyclopentadienyl ligand via competition with an amidinate", Dalton Transactions, vol. 42, No. 47, Sep. 25, 2013, pp. 16466-16469.

Xu, P. et al., "Dehydrogenation of (Di) amine-Boranes by Highly Active Scandocene Alkyl Catalysts", Organometallics, vol. 38, No. 16, Aug. 7, 2019, pp. 3212-3217.

Zhao, B., "Thermal and plasma-enhanced atomic layer deposition of yttrium oxide films and the properties of water wettability", ACS applied materials & interfaces, vol. 12, No. 2, 2020, pp. 3179-3187.

"International Preliminary Report on Patentability received for PCT Application No. PCT/EP2021/082084, mailing dated Jun. 1, 2023", 10 Pages.

* cited by examiner

LANTHANIDE AND LANTHANIDE-LIKE TRANSITION METAL COMPLEXES

BACKGROUND

This application is a national stage application, filed under 35 U.S.C. § 371, of International Patent Application No. PCT/EP2021/082084 (filed 18 Nov. 2021) which claims the benefit of U.S. Provisional Patent Application No. 63/116,487 (filed 20 Nov. 2020) each of which applications is incorporated herein by reference in their entirety.

Field

The disclosed and claimed subject matter relates to organometallic compounds including lanthanide and/or lanthanide-like transition metals, compositions containing the compounds and methods of using the compounds as precursors for deposition of metal-containing films.

Related Art

Transition metal-containing films are used in semiconductor and electronics applications. Chemical Vapor Deposition (CVD) and Atomic Layer Deposition (ALD) have been applied as the main deposition techniques for producing thin films for semiconductor devices. These methods enable the achievement of conformal films (metal, metal oxide, metal nitride, metal silicide, and the like) through chemical reactions of metal-containing compounds (precursors). The chemical reactions occur on surfaces which may include metals, metal oxides, metal nitrides, metal silicides, and other surfaces. In CVD and ALD, the precursor molecule plays a critical role in achieving high quality films with high conformality and low impurities. The temperature of the substrate in CVD and ALD processes is an important consideration in selecting a precursor molecule. Higher substrate temperatures, in the range of 150 to 500 degrees Celsius (° C.), promote a higher film growth rate. The preferred precursor molecules must be stable in this temperature range. The preferred precursor is capable of being delivered to the reaction vessel in a liquid phase. Liquid phase delivery of precursors generally provides a more uniform delivery of the precursor to the reaction vessel than solid phase precursors.

U.S. Pat. No. 8,283,201 discloses precursor compounds having a cyclopentadienyl ligand having at least one aliphatic group as a substituent and an amidine ligand. In particular, the disclosed structures include lanthanide-containing precursors of the formula $Ln(R^1Cp)_m(R^2-N-C(R^4)=N-R^2)_n$, where (i) Ln is a lanthanide metal having an ionic radius from approximately 0.75 Å to approximately 0.94 Å, a 3+ charge, and a coordination number of 6, (ii) $R^1$ is selected from the group consisting of H and a $C_1$-$C_5$ alkyl chain, (iii) $R^2$ is selected from the group consisting of H and a $C_1$-$C_5$ alkyl chain, (iv) $R^4$ is selected from the group consisting of H and Me, (v) n and m range from 1 to 2 and (vi) the precursor has a melting point below approximately 105° C. Among other things, the disclosed precursors do not include any heteroatoms substituents (i.e., as any of the $R^1$ groups) on the Cp ring.

U.S. Patent Application Publication No. 2019/0152996 (U.S. patent application Ser. No. 16/251,236) discloses a lanthanum-containing compound of the following formula

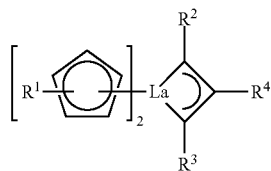

[Formula 1]

where $R^1$ is a hydrogen atom or a C1-C4 linear or branched alkyl group, $R^2$ and $R^3$ are each independently a hydrogen atom or a C1-C5 linear or branched alkyl group, at least one of $R^2$ and $R^3$ being a C3-C5 branched alkyl group, and $R^4$ is a hydrogen atom or a C1-C4 linear or branched alkyl group. As was the case with compounds disclosed in U.S. Pat. No. 8,283,201, the disclosed compounds do not include any heteroatom substituents (i.e., as any of the $R^1$ groups) may provide further coordination with the metal. In this regard, during prosecution of this application, the USPTO acknowledged that U.S. Pat. No. 8,283,201 fails to teach or suggest an asymmetrical amidinate where $R^2$ and $R^3$ are different from one another.

There is a need in the art for thermally stable lanthanide and/or lanthanide-like organometallic compounds suitable as CVD and ALD precursors that can be preferably delivered in liquid phase, have low impurities and can produce a high-quality film with high conformality.

SUMMARY

The disclosed and claimed subject matter provides precursors having at least one tethered cyclopentadienyl ligand ("Cp ligand"), at least one amidinate ligand ("Ad ligand") and a lanthanide and/or lanthanide-like transition metal ("M") of the general formulae (i) (Cp ligand)$_2$-M-(Ad ligand) or (ii) (Cp ligand)-M-(Ad ligand)$_2$. The disclosed and claimed subject matter further includes compositions containing the compounds, methods of using the compounds as precursors for deposition of metal-containing films and films derived from the precursors.

In some embodiments, the precursors having at least one tethered cyclopentadienyl ligand and at least one amidinate ligand have Formula I:

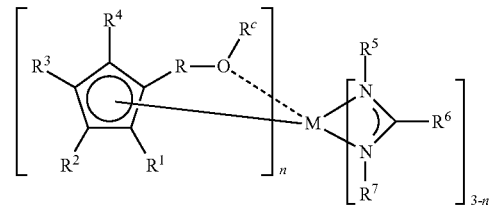

Formula I where (i) M is one of La, Sc, Y, Ce, Pr, Nd, Pm, Sm, Eu, Gd, Tb, Dy, Ho, Er, Tm, Yb and Lu, (ii) $R^1$, $R^2$, $R^3$, $R^4$, $R^5$, $R^6$ and $R^7$ are each independently selected from H, D, an unsubstituted linear $C_1$-$C_6$ alkyl group, a linear $C_1$-$C_6$ alkyl group substituted with a halogen, a linear $C_1$-$C_6$ alkyl group substituted with an amino group, an unsubstituted branched $C_3$-$C_6$ alkyl group and a branched $C_3$-$C_6$ alkyl group substituted with a halogen, a branched $C_3$-$C_6$ alkyl group substituted with an amino group and —Si(CH$_3$)$_3$, (iii) R is a linear or branched $C_1$-$C_6$ alkylene, (iv) $R^c$ is H, D, an unsubstituted linear $C_1$-$C_3$ linear alkyl group or an unsubstituted branched $C_3$-$C_6$ alkyl group, (v) n=1 or 2. Precursors of Formula I include compounds of general formulae (i) (Cp ligand)$_2$-M-(Ad ligand) and (ii) (Cp ligand)-M-(Ad ligand)$_2$ where the Cp ligand includes an oxygen-containing side chain.

In other embodiments, the precursors having at least one tethered cyclopentadienyl ligand and at least one amidinate ligand have Formula II:

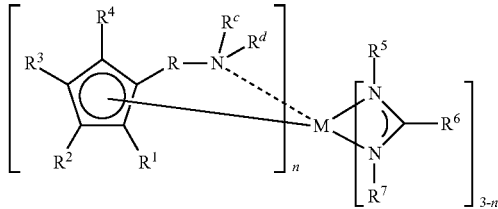

Formula II where (i) M is one of La, Sc, Y, Ce, Pr, Nd, Pm, Sm, Eu, Gd, Tb, Dy, Ho, Er, Tm, Yb and Lu, (ii) $R^1$, $R^2$, $R^3$, $R^4$, $R^5$, $R^6$ and $R^7$ are each independently selected from H, D, an unsubstituted linear $C_1$-$C_6$ alkyl group, a linear $C_1$-$C_6$ alkyl group substituted with a halogen, a linear $C_1$-$C_6$ alkyl group substituted with an amino group and an unsubstituted branched $C_3$-$C_6$ alkyl group, a branched $C_3$-$C_6$ alkyl group substituted with a halogen, a branched $C_3$-$C_6$ alkyl group substituted with an amino group and —Si(CH$_3$)$_3$, (iii) R is a linear or branched $C_1$-$C_6$ alkylene, (iv) $R^c$ and $R^d$ are each independently selected from H, D, an unsubstituted linear $C_1$-$C_3$ linear alkyl group or an unsubstituted branched $C_3$-$C_6$ alkyl group, (v) n=1 or 2. Precursors of Formula II include compounds of general formulae (i) (Cp ligand)$_2$-M-(Ad ligand) and (ii) (Cp ligand)-M-(Ad ligand)$_2$ where the Cp ligand includes a nitrogen-containing side chain.

More specific aspects and embodiments of precursors of general formulae (i) (Cp ligand)$_2$-M-(Ad ligand) and (ii) (Cp ligand)-M-(Ad ligand)$_2$, Formula I and Formula II, respectively, are detailed below.

The disclosed and claimed subject further includes (i) compositions and formulations that include the disclosed and claimed precursors, (ii) methods of using the disclosed and claimed precursors in deposition processes and (iii) metal-containing films derived from the disclosed and claimed precursors produced in deposition processes.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings.

DETAILED DESCRIPTION

Figure 1:
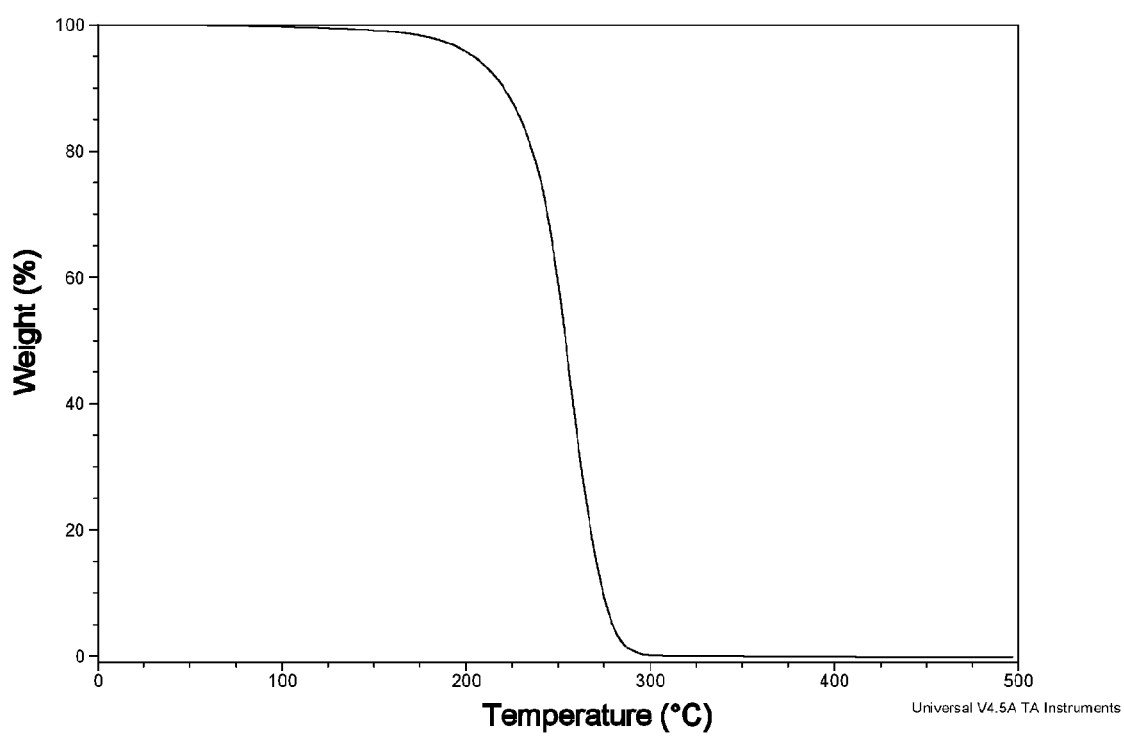
FIG. 1 illustrates the thermogravimetric analysis (TGA) of Example 1, La[Cp(CH$_2$)$_3$OCH$_3$][(C$_3$H$_7$)NC(H)N(C$_3$H$_7$)]$_2$ ("(1B)-La-(3C)$_2$")

All references, including publications, patent applications, and patents, cited herein are hereby incorporated by reference to the same extent as if each reference were individually and specifically indicated to be incorporated by reference and were set forth in its entirety herein, including U.S. Pat. No. 8,283,201 and U.S. Patent Application Publication No. 2019/0152996.

The use of the terms "a" and "an" and "the" and similar referents in the context of describing the disclosed and claimed subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed and claimed subject matter and does not pose a limitation on the scope of the disclosed and claimed subject matter unless otherwise claimed. No language in the specification should be construed as indicating any non-claimed element as essential to the practice of the disclosed and claimed subject matter. The use of the term "comprising" or "including" in the specification and the claims includes the narrower language of "consisting essentially of" and "consisting of."

Embodiments of the disclosed and claimed subject matter are described herein, including the best mode known to the inventors for carrying out the disclosed and claimed subject matter. Variations of those embodiments may become apparent to those of ordinary skill in the art upon reading the foregoing description. The inventors expect skilled artisans to employ such variations as appropriate, and the inventors intend for the disclosed and claimed subject matter to be practiced otherwise than as specifically described herein. Accordingly, the disclosed and claimed subject matter includes all modifications and equivalents of the subject matter recited in the claims appended hereto as permitted by applicable law. Moreover, any combination of the above-described elements in all possible variations thereof is encompassed by the disclosed and claimed subject matter unless otherwise indicated herein or otherwise clearly contradicted by context.

The term "alkylene" refers an alkylene linkage between (i) one carbon atom in a cyclopentadienyl ("Cp") group and (ii) O or N atoms, preferably, $C_{1-4}$ alkylene linkages such as an ethylene bridge. Specific examples of the alkylene linkages include methylene (—$CH_2$—), ethylene (—$CH_2CH_2$—), substituted ethylenes, (e.g., —$CH(CH_3)$ $CH_2$—; —$CH(CH_3)CH(CH_3)$—; —$C(CH_3)_2CH_2$—), propylene (—$CH_2CH_2CH_2$—) and substituted propylenes.

It will be understood that the term "silicon" as deposited as a material on a microelectronic device will include polysilicon.

For ease of reference, "microelectronic device" or "semiconductor device" corresponds to semiconductor wafers having integrated circuits, memory, and other electronic structures fabricated thereon, and flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" or "semiconductor device" is not meant to be limiting in any way and includes any substrate that will eventually become a microelectronic device or microelectronic assembly.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %. As used herein, "about" or "approximately" are intended to correspond to within ±5% of the stated value.

In all such compositions, wherein specific components of the composition are discussed in reference to weight percentage (or "weight %") ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%. Any reference to "one or more" or "at least one" includes "two or more" and "three or more" and so on.

Where applicable, all weight percents unless otherwise indicated are "neat" meaning that they do not include the aqueous solution in which they are present when added to the composition. For example, "neat" refers to the weight % amount of an undiluted acid or other material (i.e., the inclusion 100 g of 85% phosphoric acid constitutes 85 g of the acid and 15 grams of diluent).

Moreover, when referring to the compositions described herein in terms of weight %, it is understood that in no event shall the weight % of all components, including non-essential components, such as impurities, add to more than 100 weight %. In compositions "consisting essentially of" recited components, such components may add up to 100 weight % of the composition or may add up to less than 100 weight %. Where the components add up to less than 100 weight %, such composition may include some small amounts of a non-essential contaminants or impurities. For example, in one such embodiment, the formulation can contain 2% by weight or less of impurities. In another embodiment, the formulation can contain 1% by weight or less than of impurities. In a further embodiment, the formulation can contain 0.05% by weight or less than of impurities. In other such embodiments, the constituents can form at least 90 wt %, more preferably at least 95 wt %, more preferably at least 99 wt %, more preferably at least 99.5 wt %, most preferably at least 99.9 wt %, and can include other ingredients that do not material affect the performance of the wet etchant. Otherwise, if no significant non-essential impurity component is present, it is understood that the composition of all essential constituent components will essentially add up to 100 weight %.

The headings employed herein are not intended to be limiting; rather, they are included for organizational purposes only.

Exemplary Embodiments

One aspect of the disclosed and claimed subject matter pertains to precursors having at least one tethered cyclopentadienyl ligand ("Cp ligand"), at least one amidinate ligand ("Ad ligand") and a lanthanide and/or lanthanide-like transition metal ("M") of general formulae (i) (Cp ligand)$_2$-M-(Ad ligand) or (ii) (Cp ligand)-M-(Ad ligand)$_2$.

One aspect of the disclosed and claimed subject matter pertains to precursors having at least one tethered cyclopentadienyl ligand ("Cp ligand"), at least one amidinate ligand ("Ad ligand"), of general formula (Cp ligand)$_2$-M-(Ad ligand) wherein M is one of La, Sc, Y, Ce, Pr, Nd, Pm, Sm, Eu, Gd, Tb, Dy, Ho, Er, Tm, Yb and Lu. In one aspect of this embodiment M is La.

One aspect of the disclosed and claimed subject matter pertains to precursors having at least one tethered cyclopentadienyl ligand ("Cp ligand"), at least one amidinate ligand ("Ad ligand") and a lanthanide and/or lanthanide-like transition metal ("M") of general formulae (Cp ligand)-M-(Ad ligand)$_2$, wherein M is one of La, Sc, Y, Ce, Pr, Nd, Pm, Sm, Eu, Gd, Tb, Dy, Ho, Er, Tm, Yb and Lu. In one aspect of this embodiment M is La.

In some embodiments, the tethered Cp ligand has a structure illustrated in Table 1 (Cp ligands including an oxygen-containing side chain) or Table 2 (Cp ligands including a nitrogen-containing side chain) and/or an Ad ligand shown in Table 3, below.

TABLE 1

| Cp Structure | |
|---|---|
| Cp-(CH$_2$)$_4$OCH$_3$ | 1A |
| Cp-(CH$_2$)$_3$OCH$_3$ | 1B |
| Cp-(CH$_2$)$_2$OCH$_3$ | 1C |
| Cp-CH$_2$OCH$_3$ | 1D |
| Cp-(CH$_2$)$_2$OCH$_2$CH$_3$ | 1E |
| Cp-CH$_2$OCH$_2$CH$_3$ | 1F |
| Cp-CH(CH$_3$)(CH$_2$)$_2$OCH$_3$ | 1G |
| Cp-C(CH$_3$)$_2$(CH$_2$)$_2$OCH$_3$ | 1H |
| Cp-CH(CH$_3$)CH$_2$OCH$_3$ | 1I |
| Cp-C(CH$_3$)$_2$CH$_2$OCH$_3$ | 1J |
| Cp-CH(CH$_3$)OCH$_3$ | 1K |
| Cp-C(CH$_3$)$_2$OCH$_3$ | 1L |
| H$_3$C-Cp-(CH$_2$)$_4$OCH$_2$CH$_3$ | 1M |

TABLE 1-continued

| Cp Structure | |
|---|---|
| (CH$_2$CH$_3$)-Cp-(CH$_2$)$_3$OCH$_3$ | 1N |
| (H$_3$C)$_2$CH-Cp-(CH$_2$)$_2$OCH$_3$ | 1O |
| Cp-CH$_2$OCH$_3$ (CH$_2$CH$_3$) | 1P |
| (H$_3$C)$_2$CH-Cp-(CH$_2$)$_2$OCH$_2$CH$_3$ | 1Q |
| H$_3$C-Cp-CH$_2$OCH$_2$CH$_3$ | 1R |
| H$_3$C-Cp-CH$_2$OCH$_3$ | 1S |
| H$_3$C-Cp-(CH$_2$)$_2$OCH$_3$ | 1T |
| H$_3$C-Cp-(CH$_2$)$_3$OCH$_3$ | 1U |

Table 2

| Cp Structure | |
|---|---|
| Cp-(CH$_2$)$_4$N(CH$_3$)$_2$ | 2A |
| Cp-(CH$_2$)$_3$N(CH$_3$)$_2$ | 2B |
| Cp-(CH$_2$)$_2$N(CH$_3$)$_2$ | 2C |
| Cp-CH$_2$N(CH$_3$)$_2$ | 2D |
| Cp-(CH$_2$)$_2$N(CH$_2$CH$_3$)$_2$ | 2E |
| Cp-CH$_2$N(CH$_2$CH$_3$)$_2$ | 2F |

Table 2-continued

| Cp Structure | |
|---|---|
| (Cp with CH(CH₃)(CH₂)₂N(CH₃)₂) | 2G |
| (Cp with C(CH₃)(CH(CH₃))(CH₂)₂N(CH₃)₂) | 2H |
| (Cp with CH(CH₃)CH₂N(CH₃)₂) | 2I |
| (Cp with C(CH₃)(CH(CH₃))CH₂N(CH₃)₂) | 2J |
| (Cp with CH(CH₃)N(CH₃)₂) | 2K |
| (Cp with C(CH₃)(CH₃)N(CH₃)₂) | 2L |
| (H₃C-Cp-(CH₂)₄N(CH₂CH₃)₂) | 2M |
| (CH₂CH₃-Cp-(CH₂)₃N(CH₃)₂) | 2N |
| ((H₃C)(H₃C)CH-Cp-(CH₂)₂N(CH₃)₂) | 2O |
| (Cp with CH₂N(CH₃)₂ and CH₂CH₃) | 2P |
| ((H₃C)(H₃C)CH-Cp-(CH₂)₂N(CH₂CH₃)₂) | 2Q |
| (H₃C-Cp-CH₂N(CH₂CH₃)₂) | 2R |
| (H₃C-Cp-CH₂N(CH₃)₂) | 2S |

Table 2-continued

| Cp Structure | |
|---|---|
| (H₃C-Cp-(CH₂)₂N(CH₃)₂) | 2T |
| (H₃C-Cp-(CH₂)₃N(CH₃)₂) | 2U |

TABLE 3

| Amidinate Structure | |
|---|---|
| [H₃C–N=⟨⟩=N–CH₃]⁻ | 3A |
| [H₃CH₂C–N=⟨⟩=N–CH₂CH₃]⁻ | 3B |
| [(H₃C)₂HC–N=⟨⟩=N–CH(CH₃)₂]⁻ | 3C |
| [(H₃C)₃HC–N=⟨CH₃⟩=N–CH(CH₃)₃]⁻ | 3D |
| [H₃C–N=⟨CH₃⟩=N–CH₃]⁻ | 3E |
| [H₃CH₂C–N=⟨CH₃⟩=N–CH₂CH₃]⁻ | 3F |
| [(H₃C)₃HC–N=⟨CH₃⟩=N–CH(CH₃)₃]⁻ | 3G |
| [(H₃C)₃C–N=⟨CH₃⟩=N–C(CH₃)₃]⁻ | 3H |
| [H₃C–N=⟨CH₂CH₃⟩=N–CH₃]⁻ | 3I |
| [H₃CH₂C–N=⟨CH₂CH₃⟩=N–CH₂CH₃]⁻ | 3J |
| [(H₃C)₃HC–N=⟨CH₂CH₃⟩=N–CH(CH₃)₃]⁻ | 3K |

TABLE 3-continued

| Amidinate Structure | |
|---|---|
| [(H₃C)₃C-N=C(CH₂CH₃)-N-C(CH₃)₃]⁻ | 3L |
| [H₃C-N=C(CH(CH₃)₂)-N-CH₃]⁻ | 3M |
| [H₃CH₂C-N=C(CH(CH₃)₂)-N-CH₂CH₃]⁻ | 3N |
| [(H₃C)₂HC-N=C(CH(CH₃)₂)-N-CH(CH₃)₃]⁻ | 3O |
| [(H₃C)₃C-N=C(CH(CH₃)₂)-N-C(CH₃)₃]⁻ | 3P |
| [H₃C-N=C(CH₃)-N-CH₂CH₃]⁻ | 3Q |
| [H₃C-N=C(CH₃)-N-CH(CH₃)₂]⁻ | 3R |
| [H₃C-N=C(CH₃)-N-C(CH₃)₃]⁻ | 3S |
| [H₃C-N=C(CH₃)-N-CH(CH₂CH₃)CH₃]⁻ | 3T |
| [(H₃C)₃HC-N=C(CH₃)-N-CH₂CH₃]⁻ | 3U |
| [H₃C-N=C(CH₃)-N-C(CH₃)₃]⁻ | 3V |
| [(H₃C)₃HC-N=C(CH₃)-N-CH(CH₂CH₃)CH₃]⁻ | 3W |

Preferred embodiments of general formulae (i) (Cp ligand)$_2$-M-(Ad ligand) and (ii) (Cp ligand)-M-(Ad ligand), that include the ligands set forth in Tables 1-3 are described in Tables 4-6:

TABLE 4

| Formula | Compound | Formula | Compound |
|---|---|---|---|
| (1A)-La-(3A)₂ | [structure] | (1C)-La-(3A)₂ | [structure] |
| (1A)-La-(3B)₂ | [structure] | (1C)-La-(3B)₂ | [structure] |

TABLE 4-continued

| Formula | Compound | Formula | Compound |
|---|---|---|---|
| (1A)-La-(3C)₂ | | (1C)-La-(3C)₂ | |
| (1A)-La-(3D)₂ | | (1C)-La-(3D)₂ | |
| (1A)-La-(3E)₂ | | (1C)-La-(3E)₂ | |
| (1A)-La-(3F)₂ | | (1C)-La-(3F)₂ | |
| (1A)-La-(3G)₂ | | (1C)-La-(3G)₂ | |
| (1A)-La-(3H)₂ | | (1C)-La-(3H)₂ | |

TABLE 4-continued

| Formula | Compound | Formula | Compound |
|---|---|---|---|
| (1B)-La-(3A)₂ | | (1D)-La-(3A)₂ | |
| (1B)-La-(3B)₂ | | (1D)-La-(3B)₂ | |
| (1B)-La-(3C)₂ | | (1D)-La-(3C)₂ | |
| (1B)-La-(3D)₂ | | (1D)-La-(3D)₂ | |
| (1B)-La-(3E)₂ | | (1D)-La-(3E)₂ | |
| (1B)-La-(3F)₂ | | (1D)-La-(3F)₂ | |

TABLE 4-continued

| Formula | Compound | Formula | Compound |
|---|---|---|---|
| (1B)-La-(3G)$_2$ | | (1D)-La-(3G)$_2$ | |
| (1B)-La-(3H)$_2$ | | (1D)-La-(3H)$_2$ | |

TABLE 5

| Formula | Compound | Formula | Compound |
|---|---|---|---|
| (1A)$_2$-La-(3A) | | (1C)$_2$-La-(3A) | |
| (1A)$_2$-La-(3B) | | (1C)$_2$-La-(3B) | |
| (1A)$_2$-La-(3C) | | (1C)$_2$-La-(3C) | |

TABLE 5-continued
| Formula | Compound | Formula | Compound |
|---|---|---|---|
| (1A)₂-La-(3D) | 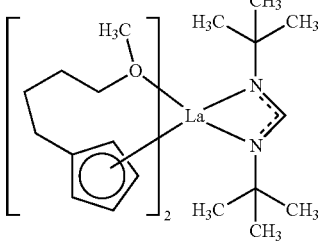 | (1C)₂-La-(3D) | 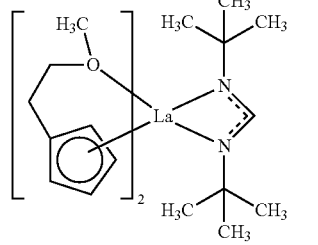 |
| (1A)₂-La-(3E) | 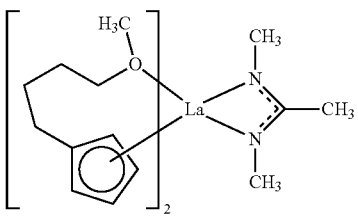 | (1C)₂-La-(3E) | 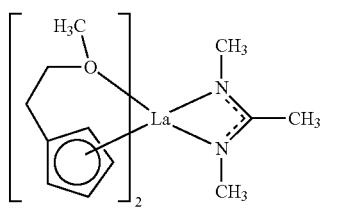 |
| (1A)₂-La-(3F) | 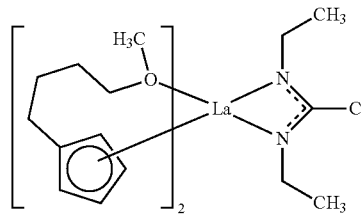 | (1C)₂-La-(3F) | 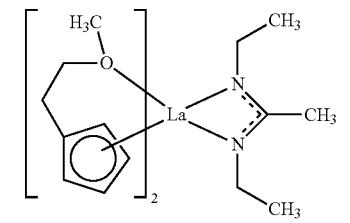 |
| (1A)₂-La-(3G) | 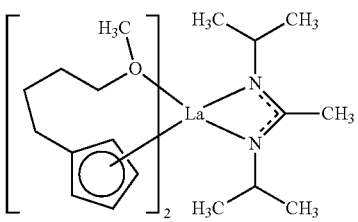 | (1C)₂-La-(3G) | 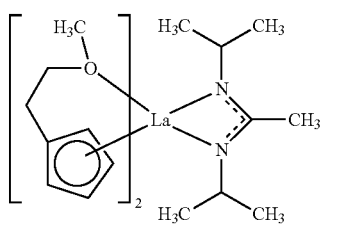 |
| (1A)₂-La-(3H) | 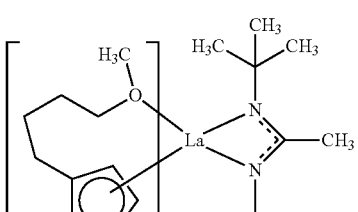 | (1C)₂-La-(3H) | 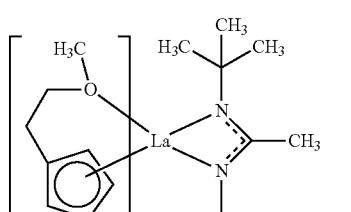 |
| (1B)₂-La-(3A) | 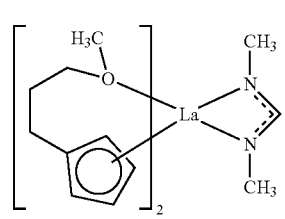 | (1D)₂-La-(3A) | 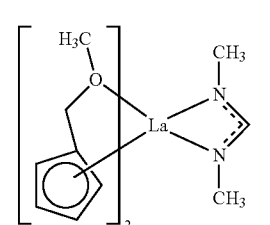 |

TABLE 5-continued

| Formula | Compound | Formula | Compound |
|---|---|---|---|
| (1B)₂-La-(3B) | | (1D)₂-La-(3B) | |
| (1B)₂-La-(3C) | | (1D)₂-La-(3C) | |
| (1B)₂-La-(3D) | | (1D)₂-La-(3D) | |
| (1B)₂-La-(3E) | | (1D)₂-La-(3E) | |
| (1B)₂-La-(3F) | | (1D)₂-La-(3F) | |
| (1B)₂-La-(3G) | | (1D)₂-La-(3G) | |

TABLE 5-continued

| Formula | Compound | Formula | Compound |
| --- | --- | --- | --- |
| (1B)$_2$-La-(3H) | | (1D)$_2$-La-(3H) | |

TABLE 6

| Formula | Compound | Formula | Compound |
| --- | --- | --- | --- |
| (2A)-La-(3A)$_2$ | | (2C)-La-(3A)$_2$ | |
| (2A)-La-(3B)$_2$ | | (2C)-La-(3B)$_2$ | |
| (2A)-La-(3C)$_2$ | | (2C)-La-(3C)$_2$ | |
| (2A)-La-(3D)$_2$ | | (2C)-La-(3D)$_2$ | |

TABLE 6-continued

| Formula | Compound | Formula | Compound |
| --- | --- | --- | --- |
| (2A)-La-(3E)₂ | | (2C)-La-(3E)₂ | |
| (2A)-La-(3F)₂ | | (2C)-La-(3F)₂ | |
| (2A)-La-(3G)₂ | | (2C)-La-(3G)₂ | |
| (2A)-La-(3H)₂ | | (2C)-La-(3H)₂ | |
| (2B)-La-(3A)₂ | | (2D)-La-(3A)₂ | |
| (2B)-La-(3B)₂ | | (2D)-La-(3B)₂ | |

TABLE 6-continued

| Formula | Compound | Formula | Compound |
|---|---|---|---|
| (2B)-La-(3C)₂ | | (2D)-La-(3C)₂ | |
| (2B)-La-(3D)₂ | | (2D)-La-(3D)₂ | |
| (2B)-La-(3E)₂ | | (2D)-La-(3E)₂ | |
| (2B)-La-(3F)₂ | | (2D)-La-(3F)₂ | |
| (2B)-La-(3G)₂ | | (2D)-La-(3G)₂ | |
| (2B)-La-(3H)₂ | | (2D)-La-(3H)₂ | |

The disclosed and claimed precursors are not limited to those exemplified in Tables 4-6. In addition, the Cp ligands and Ad ligands are no limited to those exemplified in Tables 1-3. Additional embodiments of the disclosed and claimed precursors are described below by reference to Formula I and Formula II.

Formula I Embodiments

Embodiments and aspects thereof of precursors having at least one tethered cyclopentadienyl ligand and at least one amidinate ligand having Formula I are exemplified as follows. As noted above, precursors of Formula I include compounds of general formulae (i) (Cp ligand)$_2$-M-(Ad ligand) and (ii) (Cp ligand)-M-(Ad ligand)$_2$ where the Cp ligand includes an oxygen-containing side chain.

In one embodiment, the precursor having at least one tethered cyclopentadienyl ligand and at least one amidinate ligand has Formula I:

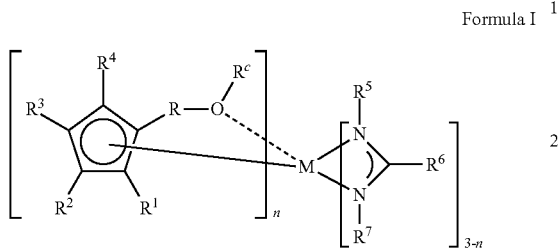

Formula I where (i) M is one of La, Sc, Y, Ce, Pr, Nd, Pm, Sm, Eu, Gd, Tb, Dy, Ho, Er, Tm, Yb and Lu, (ii) $R^1$, $R^2$, $R^3$, $R^4$, $R^5$, $R^6$ and $R^7$ are each independently selected from H, D, an unsubstituted linear $C_1$-$C_6$ alkyl group, a linear $C_1$-$C_6$ alkyl group substituted with a halogen, a linear $C_1$-$C_6$ alkyl group substituted with an amino group, an unsubstituted branched $C_3$-$C_6$ alkyl group, a branched $C_3$-$C_6$ alkyl group substituted with a halogen, a branched $C_3$-$C_6$ alkyl group substituted with an amino group and —Si(CH$_3$)$_3$, (iii) R is a linear or branched $C_1$-$C_6$ alkylene, (iv) $R^c$ is H, D or an unsubstituted linear $C_1$-$C_3$ linear alkyl group, (v) n=1 or 2.

In one aspect of this embodiment, M is La. In another aspect of this embodiment, M is Sc. In another aspect of this embodiment, M is Y. In another aspect of this embodiment, M is Ce. In another aspect of this embodiment, M is Pr. In another aspect of this embodiment, M is Nd. In another aspect of this embodiment, M is Pm. In another aspect of this embodiment, M is Sm. In another aspect of this embodiment, M is Eu. In another aspect of this embodiment, M is Gd. In another aspect of this embodiment, M is Tb. In another aspect of this embodiment, M is Dy. In another aspect of this embodiment, M is Ho. In another aspect of this embodiment, M is Er. In another aspect of this embodiment, M is Tm. In another aspect of this embodiment, M is Yb. In another aspect of this embodiment, M is Lu. Preferably, M is La.

In one aspect of this embodiment, $R^1$, $R^2$, $R^3$, $R^4$, $R^5$, $R^6$ and $R^7$ are all the same.

In one aspect of this embodiment, at least one of $R^1$, $R^2$, $R^3$, $R^4$, $R^5$, $R^6$, and $R^7$ is different than the other of $R^1$, $R^2$, $R^3$, $R^4$, $R^5$, $R^6$ and $R^7$.

In one aspect of this embodiment, $R^1$, $R^2$, $R^3$, $R^4$, $R^5$, $R^6$ and $R^7$ are each independently selected from H, D, an unsubstituted linear $C_1$-$C_4$ linear alkyl group, an unsubstituted branched $C_3$-$C_6$ alkyl group and —Si(Me)$_3$. In one aspect of this embodiment, $R^1$, $R^2$, $R^3$, $R^4$ are each independently selected from H, D and $R^5$, $R^6$ and $R^7$ are each independently selected from H, D, an unsubstituted linear $C_1$-$C_4$ alkyl group, an unsubstituted branched $C_3$-$C_6$ alkyl group and —Si(Me)$_3$. In one aspect of this embodiment, $R^6$ is H or D and $R^5$, $R^7$ are independently an unsubstituted linear $C_1$-$C_4$ alkyl group, an unsubstituted branched $C_3$-$C_6$ alkyl group and —Si(Me)$_3$.

In one aspect of this embodiment, one or more of $R^5$, $R^6$ and $R^7$ is an isopropyl group. In another aspect of this embodiment, two or more of $R^5$, $R^6$ and $R^7$ is an isopropyl group. In another aspect of this embodiment, each of $R^5$, $R^6$ and $R^7$ is an isopropyl group.

In one aspect of this embodiment, n=1. In another aspect of this embodiment, n=2.

In one aspect of this embodiment, R is —(CH$_2$)—.
In one aspect of this embodiment, R is —(CH$_2$)$_2$—.
In one aspect of this embodiment, R is —(CH$_2$)$_3$—.
In one aspect of this embodiment, R is —(CH$_2$)$_4$—.
In one aspect of this embodiment, R is —C(CH$_3$)$_2$—.
In one aspect of this embodiment, R is —CH(CH$_3$)—.
In one aspect of this embodiment, R is —C(CH$_3$)$_2$CH$_2$—.
In one aspect of this embodiment, R is —CH(CH$_3$)CH$_2$—.
In one aspect of this embodiment, R is —C(CH$_3$)$_2$(CH$_2$)$_2$—.
In one aspect of this embodiment, R is —CH(CH$_3$)(CH$_2$)$_2$—.

In one aspect of this embodiment, $R^c$ is -D. In one aspect of this embodiment, $R^c$ is —H.
In one aspect of this embodiment, $R^c$ is —CH$_3$.
In one aspect of this embodiment, $R^c$ is —CH$_2$CH$_3$.
In one aspect of this embodiment, $R^c$ is —CH$_2$CH$_2$CH$_3$.

In one aspect of this embodiment, (i) $R^5$, and $R^7$ are each an isopropyl group and (ii) $R^6$ is H.

In one aspect of this embodiment, (i) n=1, (ii) $R^5$, and $R^7$ are each an isopropyl group and (iii) $R^6$ is H.

In one aspect of this embodiment, (i) n=2, (ii) $R^5$, and $R^7$ are each an isopropyl group and (iii) $R^6$ is H.

In one aspect of this embodiment, (i) M=La, (ii) n=1, (iii) $R^5$, and $R^7$ are each an isopropyl group and (iv) $R^6$ is H.

In one aspect of this embodiment, (i) M=La, (ii) n=2, (iii) $R^5$, and $R^7$ are each an isopropyl group and (iv) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ is —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ is —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ is —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —CH$_2$—, (v) $R^c$ is —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ is —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ is —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ is —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-CH_2CH_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-CH_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-CH_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-CH_3$ and (vii) $R^6$ is H.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-CH_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-C(CH_3)_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-C(CH_3)_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-C(CH_3)_3$ and (vii) $R^6$ is H.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-C(CH_3)_3$ and (vii) $R^6$ is H.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each an isopropyl group and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each an isopropyl group and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each an isopropyl group and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each an isopropyl group and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-CH_2CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-CH_2CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-CH_2CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-CH_2CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-CH_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-C(CH_3)_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-C(CH_3)_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-C(CH_3)_3$ and (vii) $R^6$ is $-CH_3$.

In one aspect of this embodiment, (i) M=La, (ii) n=1, (iii) each of $R^1$, $R^2$, $R^3$ and $R^4$ is H, (iv) R is $-CH_2-$, (v) $R^c$ is $-CH_3$, (vi) $R^5$ and $R^7$ are each $-C(CH_3)_3$ and (vii) $R^6$ is $-CH_3$.

In one aspect of this embodiment, (i) M=La, (ii) n=2, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is $-CH_2-$, (v) $R^c$ is $-CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-CH_2-$, (v) $R^c$ is $-CH_3$, (vi) $R^5$ and $R^7$ are each $-CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_4-$, (v) $R^c$ is $-CH_3$, (vi) $R^5$ and $R^7$ are each $-CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_3-$, (v) $R^c$ is $-CH_3$, (vi) $R^5$ and $R^7$ are each $-CH_3$ and (vii) $R^6$ is H.

In one aspect of this embodiment, (i) M=La, (ii) n=2, (iii) each of $R^1$, $R^2$, $R^3$ and $R^4$ is H, (iv) R is $-(CH_2)_2-$, (v) $R^c$ is $-CH_3$, (vi) $R^5$ and $R^7$ are each $-CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each —$CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ is —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ is —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ is —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ is —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ is —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ is —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ is —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ is —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ is —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ is —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ is —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ is —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ is —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ is —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ is —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ is —$CH_3$, (vi) $R^5$ and $R^7$ are each —$C(CH_3)_3$ and (vii) $R^6$ is —$CH_3$.

Formula II Embodiments

Embodiments and aspects thereof of precursors having at least one tethered cyclopentadienyl ligand and at least one amidinate ligand having Formula II are exemplified as follows. As noted above, precursors of Formula II include compounds of general formulae (i) (Cp ligand)$_2$-M-(Ad ligand) and (ii) (Cp ligand)-M-(Ad ligand)$_2$ where the Cp ligand includes a nitrogen-containing side chain.

In another embodiment, the precursors having at least one tethered cyclopentadienyl ligand and at least one amidinate ligand have Formula II:

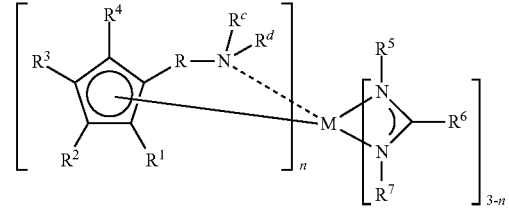

Formula II where (i) M is one of La, Sc, Y, Ce, Pr, Nd, Pm, Sm, Eu, Gd, Tb, Dy, Ho, Er, Tm, Yb and Lu, (ii) $R^1$, $R^2$, $R^3$, $R^4$, $R^5$, $R^6$ and $R^7$ are each independently selected from H, D, an unsubstituted linear $C_1$-$C_6$ alkyl group, a linear $C_1$-$C_6$ alkyl group substituted with a halogen, a linear $C_1$-$C_6$ alkyl group substituted with an amino group, an unsubstituted branched $C_3$-$C_6$ alkyl group, a branched $C_3$-$C_6$ alkyl group substituted with a halogen, a branched $C_3$-$C_6$ alkyl group substituted with an amino group and —$Si(CH_3)_3$, (iii) R is a linear or branched $C_1$-$C_6$ alkylene, (iv) $R^c$ and $R^d$ are each independently selected from H, D and an unsubstituted linear $C_1$-$C_3$ alkyl group, (v) n=1 or 2.

In one aspect of this embodiment, M is La. In another aspect of this embodiment, M is Sc. In another aspect of this embodiment, M is Y. In another aspect of this embodiment, M is Ce. In another aspect of this embodiment, M is Pr. In another aspect of this embodiment, M is Nd. In another aspect of this embodiment, M is Pm. In another aspect of this embodiment, M is Sm. In another aspect of this embodiment, M is Eu. In another aspect of this embodiment, M is Gd. In another aspect of this embodiment, M is Tb. In another aspect of this embodiment, M is Dy. In another aspect of this embodiment, M is Ho. In another aspect of this embodiment, M is Er. In another aspect of this embodiment, M is Tm. In another aspect of this embodiment, M is Yb. In another aspect of this embodiment, M is Lu. Preferably, M is La.

In one aspect of this embodiment, $R^1$, $R^2$, $R^3$, $R^4$, $R^5$, $R^6$ and $R^7$ are all the same.

In one aspect of this embodiment, at least one of $R^1$, $R^2$, $R^3$, $R^4$, $R^5$, $R^6$, and $R^7$ is different than the other of $R^1$, $R^2$, $R^3$, $R^4$, $R^5$, $R^6$ and $R^7$.

In one aspect of this embodiment, $R^1$, $R^2$, $R^3$, $R^4$, $R^5$, $R^6$ and $R^7$ are each independently selected from H, D, an unsubstituted linear $C_1$-$C_4$ linear alkyl group, an unsubstituted branched $C_3$-$C_6$ alkyl group and —Si(Me)$_3$. In one aspect of this embodiment, $R^1$, $R^2$, $R^3$, $R^4$ are each independently selected from H, D and $R^5$, $R^6$ and $R^7$ are each independently selected from H, D, an unsubstituted linear $C_1$-$C_4$ alkyl group, an unsubstituted branched $C_3$-$C_6$ alkyl group and —Si(Me)$_3$. In one aspect of this embodiment, $R^6$ is H or D and $R^5$, $R^7$ are independently an unsubstituted linear $C_1$-$C_4$ alkyl group, an unsubstituted branched $C_3$-$C_6$ alkyl group and —Si(Me)$_3$.

In one aspect of this embodiment, one or more of $R^5$, $R^6$ and $R^7$ is an isopropyl group. In another aspect of this embodiment, two or more of $R^5$, $R^6$ and $R^7$ is an isopropyl group. In another aspect of this embodiment, each of $R^5$, $R^6$ and $R^7$ is an isopropyl group.

In one aspect of this embodiment, n=1. In another aspect of this embodiment, n=2.

In one aspect of this embodiment, R is —(CH$_2$)—.
In one aspect of this embodiment, R is —(CH$_2$)$_2$—.
In one aspect of this embodiment, R is —(CH$_2$)$_3$—.
In one aspect of this embodiment, R is —(CH$_2$)$_4$—.
In one aspect of this embodiment, R is —C(CH$_3$)$_2$—.
In one aspect of this embodiment, R is —CH(CH$_3$)—.
In one aspect of this embodiment, R is —C(CH$_3$)$_2$CH$_2$—.
In one aspect of this embodiment, R is —CH(CH$_3$)CH$_2$—.
In one aspect of this embodiment, R is —C(CH$_3$)$_2$(CH$_2$)$_2$—.
In one aspect of this embodiment, R is —CH(CH$_3$)(CH$_2$)$_2$—.

In one aspect of this embodiment, at least one of $R^c$ and $R^d$ is —H. In another aspect of this embodiment, each of $R^c$ and $R^d$ is —H.

In one aspect of this embodiment, at least one of $R^c$ and $R^d$ is -D. In another aspect of this embodiment, each of $R^c$ and $R^d$ is -D.

In one aspect of this embodiment, at least one of $R^c$ and $R^d$ is —CH$_3$. In another aspect of this embodiment, each of $R^c$ and $R^d$ is —CH$_3$.

In one aspect of this embodiment, at least one of $R^c$ and $R^d$ is —CH$_2$CH$_3$. In another aspect of this embodiment, each of $R^c$ and $R^d$ is —CH$_2$CH$_3$.

In one aspect of this embodiment, at least one of $R^c$ and $R^d$ is —CH$_2$CH$_2$CH$_3$. In another aspect of this embodiment, each of $R^c$ and $R^d$ is —CH$_2$CH$_2$CH$_3$.

In one aspect of this embodiment, (i) $R^5$, and $R^7$ are each an isopropyl group and (ii) $R^6$ is H.

In one aspect of this embodiment, (i) n=1, (ii) $R^5$, and $R^7$ are each an isopropyl group and (iii) $R^6$ is H.

In one aspect of this embodiment, (i) n=2, (ii) $R^5$, and $R^7$ are each an isopropyl group and (iii) $R^6$ is H.

In one aspect of this embodiment, (i) M=La, (ii) n=1, (iii) $R^5$, and $R^7$ are each an isopropyl group and (iv) $R^6$ is H.

In one aspect of this embodiment, (i) M=La, (ii) n=2, (iii) $R^5$, and $R^7$ are each an isopropyl group and (iv) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ and $R^d$ are each —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ and $R^d$ are each —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ and $R^d$ are each —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —CH$_2$—, (v) $R^c$ and $R^d$ are each —CH$_3$, (vi) $R^5$ and $R^7$ are each an isopropyl group and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ and $R^d$ are each —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ and $R^d$ are each —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ and $R^d$ are each —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —CH$_2$—, (v) $R^c$ and $R^d$ are each —CH$_3$, (vi) $R^5$ and $R^7$ are each —CH$_2$CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ and $R^d$ are each —CH$_3$, (vi) $R^5$ and $R^7$ are each —CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ and $R^d$ are each —CH$_3$, (vi) $R^5$ and $R^7$ are each —CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ and $R^d$ are each —CH$_3$, (vi) $R^5$ and $R^7$ are each —CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —CH2, (v) $R^c$ and $R^d$ are each —CH$_3$, (vi) $R^5$ and $R^7$ are each —CH$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_4$—, (v) $R^c$ and $R^d$ are each —CH$_3$, (vi) $R^5$ and $R^7$ are each —C(CH$_3$)$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_3$—, (v) $R^c$ and $R^d$ are each —CH$_3$, (vi) $R^5$ and $R^7$ are each —C(CH$_3$)$_3$ and (vii) $R^6$ is H.

In one aspect of this embodiment, (i) M=La, (ii) n=1, (iii) each of $R^1$, $R^2$, $R^3$ and $R^4$ is H, (iv) R is —(CH$_2$)$_2$—, (v) $R^c$ and $R^d$ are each —CH$_3$, (vi) $R^5$ and $R^7$ are each —C(CH$_3$)$_3$ and (vii) $R^6$ is H.

In one aspect of this embodiment, (i) M=La, (ii) n=1, (iii) each of $R^1$, $R^2$, $R^3$ and $R^4$ is H, (iv) R is —CH$_2$—, (v) $R^c$ and $R^d$ are each —CH$_3$, (vi) $R^5$ and $R^7$ are each —C(CH$_3$)$_3$ and (vii) $R^6$ is H.

In one aspect of this embodiment, (i) M=La, (ii) n=1, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=1, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each an isopropyl group and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is —CH2, (v) $R^c$ and $R^d$ are each —$CH_3$, (vi) $R^5$ and $R^7$ are each —$CH_2CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$CH_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$C(CH_3)$; and (vii) $R^6$ is H.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^1$ are each —$C(CH_3)_3$ and (vii) $R^6$ is H.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each an isopropyl group and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$CH_2CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$CH_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_4$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_3$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$(CH_2)_2$—, (v) $R^c$ and $R^d$ are each —$CH_3$, (vi) $R^5$ and $R^7$ are each —$C(CH_3)_3$ and (vii) $R^6$ is —$CH_3$.

In one aspect of this embodiment, (i) M=La, (ii) n=2, (iii) each of $R^1$, $R^2$, $R^3$ and $R^4$ is H, (iv) R is —$CH_2$—, (v) $R^c$ and $R^d$ are each —$CH_3$, (vi) $R^5$ and $R^7$ are each —$C(CH_3)_3$ and (vii) $R^6$ is —$CH_3$.

Method of Use

The disclosed precursors may be deposited to form lanthanide-containing films using any chemical vapor deposition process known to those of skill in the art. As used herein, the term "chemical vapor deposition process" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous," it is understood that the precursors can be either liquid or solid which are transported with or without an inert gas into the reactor via direct vaporization, bubbling or sublimation. In some case, the vaporized precursors can pass through a plasma generator. The term "reactor" as used herein, includes without limitation, reaction chamber, reaction vessel or deposition chamber.

Chemical vapor deposition processes in which the disclosed and claimed precursors can be utilized include, but are not limited to, those used for the manufacture of semiconductor type microelectronic devices such as ALD, CVD, pulsed CVD, plasma enhanced ALD (PEALD) and/or plasma enhanced CVD (PECVD). Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the metal containing films are deposited via atomic layer deposition (ALD), plasma enhanced ALD (PEALD) or plasma enhanced cyclic CVD (PECCVD) process.

In one embodiment, for example, the metal-containing film is deposited using an ALD process. In another embodiment, the metal-containing film is deposited using a CCVD process. In a further embodiment, the metal-containing film is deposited using a thermal CVD process.

Suitable substrates on which the disclosed and claimed precursors can be deposited are not particularly limited and vary depending on the final use intended. For example, the substrate may be chosen from oxides such as $HfO_2$ based materials, $TiO_2$ based materials, $ZrO_2$ based materials, rare earth oxide-based materials, ternary oxide-based materials, etc. or from nitride-based films. Other substrates may include solid substrates such as metal substrates (for example, Au, Pd, Rh, Ru, W, Al, Ni, Ti, Co, Pt and metal silicides (e.g., $TiSi_2$, $CoSi_2$, and $NiSi_2$); metal nitride containing substrates (e.g., TaN, TiN, WN, TaCN, TiCN, TaSiN, and TiSiN); semiconductor materials (e.g., Si, SiGe, GaAs, InP, diamond, GaN, and SiC); insulators (e.g., $SiO_2$, $Si_3N_4$, SiON, $HfO_2$, $Ta_2O_5$, $ZrO_2$, $TiO_2$, $Al_2O_3$, and barium strontium titanate); combinations thereof. Preferred substrates include TiN, Ru and Si type substrates.

In such deposition methods and processes an oxidizing agent can be utilized. The oxidizing agent is typically introduced in gaseous form. Examples of suitable oxidizing agents include, but are not limited to, oxygen gas, water vapor, ozone, oxygen plasma, or mixtures thereof.

The deposition methods and processes may also involve one or more purge gases. The purge gas, which is used to purge away unconsumed reactants and/or reaction byproducts, is an inert gas that does not react with the precursors.

Exemplary purge gases include, but are not limited to, argon (Ar), nitrogen ($N_2$), helium (He), neon, and mixtures thereof. For example, a purge gas such as Ar is supplied into the reactor at a flow rate ranging from about 10 to about 2000 sccm for about 0.1 to 10000 seconds, thereby purging the unreacted material and any byproduct that may remain in the reactor.

The deposition methods and processes require that energy be applied to the at least one of the precursors, oxidizing agent, other precursors or combination thereof to induce reaction and to form the metal-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In some processes, a secondary RF frequency source can be used to modify the plasma characteristics at the substrate surface. When utilizing plasma, the plasma-generated process may include a direct plasma-generated process in which plasma is directly generated in the reactor, or alternatively a remote plasma-generated process in which plasma is generated outside of the reactor and supplied into the reactor.

When utilized in such deposition methods and processes suitable precursors—such as those presently disclosed and claimed—may be delivered to the reaction chamber such as a CVD or ALD reactor in a variety of ways. In some instances, a liquid delivery system may be utilized. In other instances, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. The precursor compositions described herein can be effectively used as source reagents via direct liquid injection (DLI) to provide a vapor stream of these metal precursors into an ALD or CVD reactor.

When used in these deposition methods and processes, the disclosed and claimed precursors include hydrocarbon solvents which are particularly desirable due to their ability to be dried to sub-ppm levels of water. Exemplary hydrocarbon solvents that can be used in the precursors include, but are not limited to, toluene, mesitylene, cumene (isopropylbenzene), p-cymene (4-isopropyl toluene), 1,3-diisopropylbenzene, octane, dodecane, 1,2,4-trimethylcyclohexane, n-butylcyclohexane, and decahydronaphthalene (decalin). The disclosed and claimed precursors can also be stored and used in stainless steel containers. In certain embodiments, the hydrocarbon solvent is a high boiling point solvent or has a boiling point of 100 degrees Celsius or greater. The disclosed and claimed precursors can also be mixed with other suitable metal precursors, and the mixture used to deliver both metals simultaneously for the growth of a binary metal-containing films.

A flow of argon and/or other gas may be employed as a carrier gas to help deliver a vapor containing at least one of the disclosed and claimed precursors to the reaction chamber during the precursor pulsing. When delivering the precursors, the reaction chamber process pressure is between 1 and 50 torr, preferably between 5 and 20 torr.

Substrate temperature can be an important process variable in the deposition of high-quality metal-containing films. Typical substrate temperatures range from about 150° C. to about 550° C. Higher temperatures can promote higher film growth rates.

In view of the forgoing, those skilled in the art will recognize that the disclosed and claimed subject matter further include the use of the disclosed and claimed precursors in Chemical vapor deposition processes as follows.

In one embodiment, the disclosed and claimed subject matter includes a method for forming a transition metal-containing film on at least one surface of a substrate that includes the steps of:
  a. providing the at least one surface of the substrate in a reaction vessel;
  b. forming a transition metal-containing film on the at least one surface by a deposition process chosen from a chemical vapor deposition (CVD) process and an atomic layer deposition (ALD) process using one or more of the disclosed and claimed precursors of as a metal source compound for the deposition process.

In a further aspect of this embodiment, the method includes introducing at least one reactant into the reaction vessel. In a further aspect of this embodiment, the method includes introducing at least one reactant into the reaction vessel where the at least one reactant is selected from the group of water, diatomic oxygen, oxygen plasma, ozone, NO, $N_2O$, $NO_2$, carbon monoxide, carbon dioxide and combinations thereof. In another aspect of this embodiment, the method includes introducing at least one reactant into the reaction vessel where the at least one reactant is selected from the group of ammonia, hydrazine, monoalkylhydrazine, dialkylhydrazine, nitrogen, nitrogen/hydrogen, ammonia plasma, nitrogen plasma, nitrogen/hydrogen plasma, and combinations thereof. In another aspect of this embodiment, the method includes introducing at least one reactant into the reaction vessel where the at least one reactant is selected from the group hydrogen, hydrogen plasma, a mixture of hydrogen and helium, a mixture of hydrogen and argon, hydrogen/helium plasma, hydrogen/argon plasma, boron-containing compounds, silicon-containing compounds and combinations thereof.

In one embodiment, the disclosed and claimed subject matter includes a method of forming a transition metal-containing film via an atomic layer deposition (ALD) process or ALD-like process that includes the steps of:
  a. providing a substrate in a reaction vessel;
  b. introducing into the reaction vessel one or more of the disclosed and claimed precursors;
  c. purging the reaction vessel with a first purge gas;
  d. introducing into the reaction vessel a source gas;
  e. purging the reaction vessel with a second purge gas;
  f. sequentially repeating steps b through e until a desired thickness of the transition metal-containing film is obtained.

In a further aspect of this embodiment, the source gas is one or more of an oxygen-containing source gas selected from water, diatomic oxygen, oxygen plasma, ozone, NO, $N_2O$, $NO_2$, carbon monoxide, carbon dioxide and combinations thereof. In another aspect of this embodiment, the source gas is one or more of a nitrogen-containing source gas selected from ammonia, hydrazine, monoalkylhydrazine, dialkylhydrazine, nitrogen, nitrogen/hydrogen, ammonia plasma, nitrogen plasma, nitrogen/hydrogen plasma and mixture thereof. In a further aspect of this embodiment, the method the first and second purge gases are each independently selected one or more of argon, nitrogen, helium, neon, and combinations thereof. In a further aspect of this embodiment, the method further includes applying energy to at least one of the precursor, the source gas, the substrate, and combinations thereof, wherein the energy is one or more of thermal, plasma, pulsed plasma, helicon plasma, high density plasma, inductively coupled plasma, X-ray, e-beam, photon, remote plasma methods and combinations thereof. In a further aspect of this embodiment, step b of the method further includes introducing into the reaction vessel the precursor using a stream of carrier gas to deliver a vapor of the precursor into the reaction vessel. In a further aspect of this embodiment, step b of the method further includes use of a solvent medium comprising one or more of toluene, mesitylene, isopropylbenzene, 4-isopropyl toluene, 1,3-di-isopropylbenzene, octane, dodecane, 1,2,4-trimethylcyclohexane, n-butylcyclohexane, and decahydronaphthalene and combinations thereof.

In another embodiment, the precursors having at least one tethered cyclopentadienyl ligands and at least one amidinate ligands with Formulae I and II can be used as a dopant for metal containing films, such as but not limited to, metal oxide films or metal nitride films. In these embodiments, the metal containing film is deposited using an ALD, ALD-like or CVD process such as those processes described herein using metal alkoxide, metal amide, or volatile organometallic precursors. Examples of suitable metal alkoxide precursors that may be used with the method disclosed herein include, but are not limited to, group 3 to 13 metal alkoxide, group 3 to 13 metal complexes having both alkoxy and alkyl substituted cyclopentadienyl ligands, group 3 to 6 metal complexes having both alkoxy and alkyl substituted pyrrolyl ligands, group 3 to 13 metal complexes having both alkoxy and diketonate ligands; group 3 to 13 metal complexes having alkyl ligands. Exemplary Group 3 to 13 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, W, Co, Ru, Al.

Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tris(dimethylamino)(cyclopentadienyl)zirconium, tetrakis(dimethylamino)hafnium (TDMAH), tetrakis(diethylamino) hafnium (TDEAH), and tetrakis(ethylmethylamino)hafnium (TEMAH), tris(dimethylamino)(cyclopentadienyl) hafnium, tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino) tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino) bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls.

Examples of suitable metal complexes having alkyl ligands that may be used with the method disclosed herein include, but are not limited to, tritertbutylaluminum (TTBA), trimethylaluminum (TMA), triethylaluminum (TEA), dimethylaluminum hydride (DMAH), dimethylethylaminealane (DMEAA), trimethylaminealane (TEAA), N-methylpyrroridine-alane (MPA), tri-isobutylaluminum (TIBA).

In one embodiment, the disclosed and claimed subject matter includes a method of forming a transition metal-containing film on at least one surface of a substrate, comprising:

a. providing the at least one surface of the substrate in a reaction vessel;

b. forming a transition metal-containing film on the at least one surface by a deposition process chosen from a chemical vapor deposition (CVD) process and an atomic layer deposition (ALD) process using a precursor as a metal source compound for the deposition process; and c. using one or more of the disclosed and claimed precursors as a dopant material.

In one embodiment, the disclosed and claimed subject matter includes a precursor supply package, comprising a vessel and one or more of the disclosed and claimed precursors, wherein the vessel is adapted to contain and dispense the precursor.

In one embodiment, the disclosed and claimed subject matter includes a compound of formula $La[Cp(CH_2)_3OCH_3]_3$ and a method of synthesizing a compound of Formula I, comprising using a compound of formula $La[Cp(CH_2)_3OCH_3]_3$ in the synthesis of a compound of Formula I. In another embodiment, the disclosed and claimed subject matter includes a compound of formula $La[CpCH_2N(CH_3)_2]_3$ and a method of synthesizing a compound of Formula II, comprising using a compound of formula $La[CpCH_2N(CH_3)_2]_3$ in the synthesis of a compound of Formula II.

In one embodiment, the disclosed and claimed subject matter includes the use of one or more of the disclosed and claimed precursors in a process for forming a transition metal-containing film on at least one surface of a substrate.

Examples

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods

All solvents and starting materials were purchased from Sigma-Aldrich unless otherwise indicated. $La(FAMD)_3$ was purchased from Strem Chemicals. $La(iPr-AMD)_3$ was synthesized following the procedure reported Gordon et al., *Inorg. Chem.*, 42, 7951-7958 (2003). $KCpCH_2CH_2CH_2OCH_3$ and $KCpCH_2N(CH_3)_2$ were prepared from $KN(TMS)_2$ and the corresponding Cps in toluene following the procedure reported by Evans et al., *Inorg. Chem.*, 44, 3993-4000 (2005).

Ligand Synthesis

A. Cp Ligand 1A (Table 1)

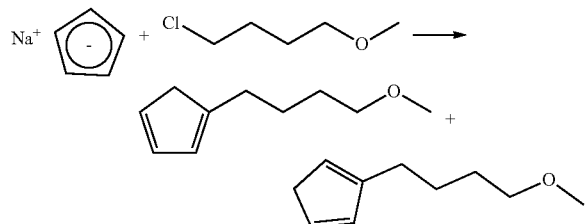

Sodium cyclopentadienide (290 mL, 0.70 mol, 2M in THF) was added dropwise to a solution of 1-chloro-4-methoxybutane (85.32 g, 0.70 mol) in THF (310 mL) at −65° C. The resulting mixture was allowed to warm up to room temperature overnight. The resulting solid was filtered off and the solvent was carefully removed under reduced pressure at 20° C. Final purification by distillation (45° C., 0.03 mbar) yielded a mixture of 1-(4-methoxybutyl)cyclopenta-1,3-diene and 2-(4-methoxybutpyl)cyclopenta-1,3-diene (21.2 g, 0.14 mol) as a colorless liquid in 20% yield.

$^1$H-NMR (CDCl$_3$, 500 MHZ): δ=6.45-5.98 (m, 3H), 3.41-3.36 (m, 2H), 3.32 (s, 3H), 2.95-2.80 (m, 2H), 2.47-2.36 (m, 2H), 1.64-1.45 (m, 4H).

EI-MS: m/z: 152.1.

Sodium cyclopentadienide (2M in THF) and 1-chloro-4-methoxybutane were purchased and used as-is from Sigma-Aldrich.

B. Cp Ligand 1B (Table 1)

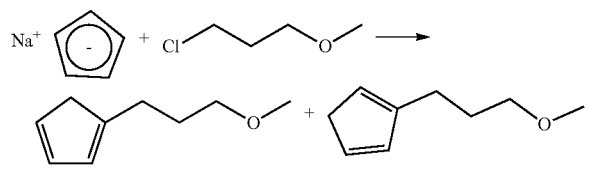

Sodium cyclopentadienide (200 mL, 0.48 mol, 2M in THF) was added dropwise to a solution of 1-chloro-3-methoxypropane (51.11 g, 0.48 mol) in THF (200 mL) at −65° C. The resulting mixture was allowed to warm up to room temperature overnight. The resulting solid was filtered off and the solvent was carefully removed under reduced pressure at 20° C. Final purification by distillation (40° C., 0.11 mbar) yielded a mixture of 1-(3-methoxypropyl)cyclopenta-1,3-diene and 2-(3-methoxypropyl)cyclopenta-1,3-diene (25.2 g, 0.18 mol) as a colorless liquid in 37% yield.

$^1$H-NMR (CDCl$_3$, 500 MHz): δ=6.45-6.00 (m, 3H), 3.41-3.37 (m, 2H), 3.33 (s, 3H), 2.95-2.80 (m, 2H), 2.49-2.40 (m, 2H), 1.86-1.79 (m, 2H).

EI-MS: m/z: 138.

Sodium cyclopentadienide (2M in THF) and 1-chloro-3-methoxypropane were purchased and used as-is from Sigma-Aldrich.

C. Cp Ligand 1D (Table 1)

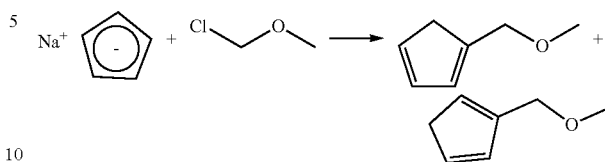

A solution of chloromethyl methyl ether (16.82 mL, 0.22 mol) in n-pentane (150 mL) was added dropwise to a stirred mixture of sodium cyclopentadienide (19.50 g, 0.22 mol) in n-pentane (350 mL) at −65° C. The resulting mixture was allowed to warm up to room temperature overnight. The resulting solid was filtered off and the solvent was carefully removed under reduced pressure at 20° C. Final purification by column chromatography (silica gel; n-pentane/methyl tert-butyl ether 9:1) yielded a mixture of 1-(methoxymethyl)cyclopenta-1,3-diene and 2-(methoxymethyl)cyclopenta-1,3-diene (12.10 g, 0.09 mol; GC: 85%) as a colorless liquid in 41% yield.

$^1$H-NMR (CDCl$_3$, 500 MHZ): δ=6.51-6.21 (m, 3H), 4.19-4.17 (m, 2H), 3.25-3.22 (m, 3H), 2.99-2.94 (m, 2H).

EI-MS: m/z: 110.

Sodium cyclopentadienide and chloromethyl methyl ether were purchased and used as-is from Sigma-Aldrich.

D. Cp Ligand 2D (Table 2)

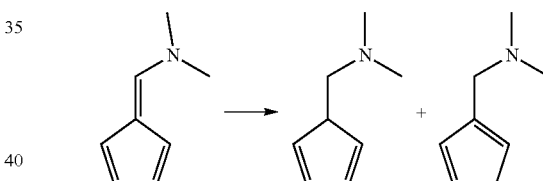

A suspension of dimethylaminofulvene (20.00 g, 0.17 mol) in diethyl ether (700mL) was added dropwise to a suspension of LiAlH$_4$ (7.52 g, 0.20 mol) in diethyl ether (100 mL) at −15° C. and the reaction mixture was stirred for additional 150 min at this temperature. Water (30 mL) and an aqueous solution of NaOH (10 mL, 10 wt %) were carefully added to the mixture at −35° C. Magnesium sulphate was added, and the reaction mixture was allowed to warm up to room temperature. The mixture was filtered, and the solvent was removed. Final purification via distillation gave [cyclopenta-2,4-dien-1-yl)methyl]dimethylamine and [cyclopenta-1,3-dien-1-yl)methyl]dimethylamine (7.10 g, 0.06 mol) as colorless liquid in 35% yield.

$^1$H-NMR (CDCl$_3$, 500 MHz): δ=6.54-6.11 (m, 3H), 3.25-3.22 (m, 2H), 3.01-3.00 (m, 2H), 2.25-2.23 (m, 6H).

EI-MS: m/z: 123.1.

Dimethylaminofulvene was purchased and used as-is from Sigma-Aldrich.

Intermediate Precursor Synthesis

A1. Synthesis of La[Cp(CH$_2$)$_3$OCH$_3$]$_3$

Inside a N$_2$ filled glovebox, THF (100 mL) was added to 250 mL Schlenk round bottom flask containing a solid mixture of LaBr$_3$ (4.29 g, 11.3 mmol) and K[Cp(CH$_2$)$_3$OCH$_3$] (6.0 g, 34.0 mmol), and a stir bar. The resulting slurry was stirred under N$_2$ at RT for 16 hours. The volatiles were then removed under vacuum to afford a sticky orange solid. The crude material was further purified by toluene extraction and filtration through a medium frit, and removal of toluene under vacuum afforded the final product as an orange oil. (3.1 g, 49% yield).

1H-NMR (C$_6$D$_6$, 400 MHZ): δ=6.04 (m, 6H), 5.90 (m, 6H), 3.17 (m, 6H), 3.07 (s, 9H), 2.59 (t, 6H), 1.75 (m, 6H).

A2. Synthesis of La[Cp(CH$_2$)$_3$OCH$_3$]$_3$

Inside an N$_2$ filled glovebox, THF (100 mL) was added to a flask containing a solid mixture of LaBr$_3$ (2.39 g, 6.3 mmol) and K[Cp(CH$_2$)$_3$OCH$_3$] (3.10 g, 19.1 mmol), and a stir bar. The resulting slurry was stirred under N$_2$ at RT for 18 hours. The volatiles were then removed under vacuum. The crude material was further purified by toluene extraction and removal of toluene under vacuum afforded the final product as an oil. (1.9 g, 59% yield).

1H-NMR (C$_6$D$_6$, 400 MHZ): δ=2.66 (t, J=6.5 Hz; 6H, —CH$_2$—); 3.09 (s, 9H, —OCH$_3$); 3.36 (t, J=6.5 Hz, 6H, —CH$_2$-Cp); 5.89 (s, 12H, CpH$_4$).

B. Synthesis of La[CpCH$_2$N(CH$_3$)$_2$]$_3$

Inside a N$_2$ filled glovebox, THF (100 mL) was added to 250 mL Schlenk round bottom flask containing a solid mixture of LaBr$_3$ (1.95 g, 5.2 mmol) and K[CpCH$_2$N(CH$_3$)$_2$] (2.50 g, 15.5 mmol), and a stir bar. The resulted slurry was stirred under N$_2$ at RT for 16 hours. The volatiles were then removed under vacuum to afford a yellow solid. The crude material was further purified by Et$_2$O extraction and filtration through a medium frit, and removal of Et$_2$O under vacuum afforded the final product as a yellow solid. (1.33 g, 51% yield).

1H-NMR (C$_6$D$_6$, 400 MHZ): δ=5.99 (m, 6H), 5.93 (m, 6H), 3.32 (s, 6H), 2.16 (s, 18H).

Final Precursor Synthesis

Example 1: La[Cp(CH$_2$)$_3$OCH$_3$][(C$_3$H$_7$)NC(H)N(C$_3$H$_7$)]$_2$ ("(1B)-La-(3C)$_2$")

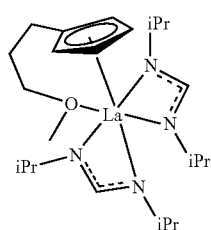

Inside a N$_2$ filled glovebox, a toluene solution of La[Cp(CH$_2$)$_3$OCH$_3$]$_3$ (0.40 g, 0.72 mmol) was added to a heavy wall pressure vessel filled with La(FAMD)$_3$ (0.748 g, 1.44 mmol). The solution was heated at 100°° C. under N$_2$ for 4 hours. The volatiles were removed under vacuum to afford a yellow solid. The crude material was further purified by sublimation at 120° C. and 130 m Torr to afford the final product as a white solid (0.45 g, 37% yield).

Figure 2:
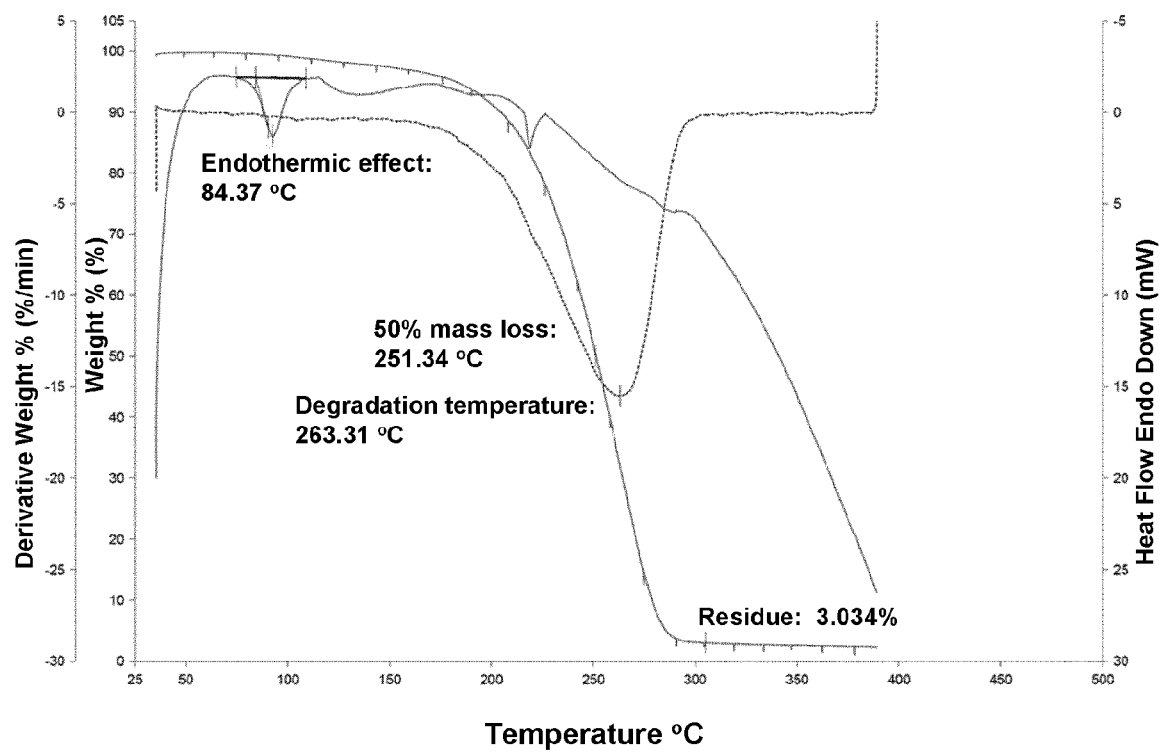
FIG. 2 illustrates the thermogravimetric analysis/DSC of Example 1, La[Cp(CH$_2$)$_3$OCH$_3$][(C$_3$H$_7$)NC(H)N(C$_3$H$_7$)]$_2$ ("(1B)-La-(3C)$_2$")

Characterization of Precursor (1B)-La-(3C)$_2$: 1H-NMR (C$_6$D$_6$, 400 MHZ): δ=8.20 (s, 2H), 6.56 (m, 2H), 6.31 (m, 2H), 3.18-3.08 (m, 6H), 3.07 (s, 3H), 2.65 (m, 2H), 1.66 (m, 2H), 1.21 (d, 24H). The TGA of this precursor is shown in FIG. 1. The TGA shows clean evaporation with low non-volatile residue. The TGA/DSC analysis of this precursor is shown in FIG. 2 (scan rate 10k/min).

Example 2: La[Cp(CH$_2$)$_3$OCH$_3$][(C$_3$H$_7$)NC(CH$_3$)N(C$_3$H$_7$)]$_2$ ("(1B)-La-(3G)$_2$")

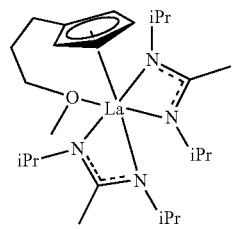

Inside a N$_2$ filled glovebox, a toluene solution of La[Cp(CH$_2$)$_3$OCH$_3$]$_3$ (0.25 g, 0.45 mmol) was added to a heavy wall pressure vessel filled with La(iPr-AMD)$_3$ (0.50 g, 0.89 mmol). The solution was heated at 100° C. under N$_2$ for 4 hours. The volatiles were removed under vacuum to afford a yellow solid. The crude material was further purified by sublimation at 130° C. and 130 mTorr to afford the final product as a white solid (0.38 g, 51% yield).

Figure 3:
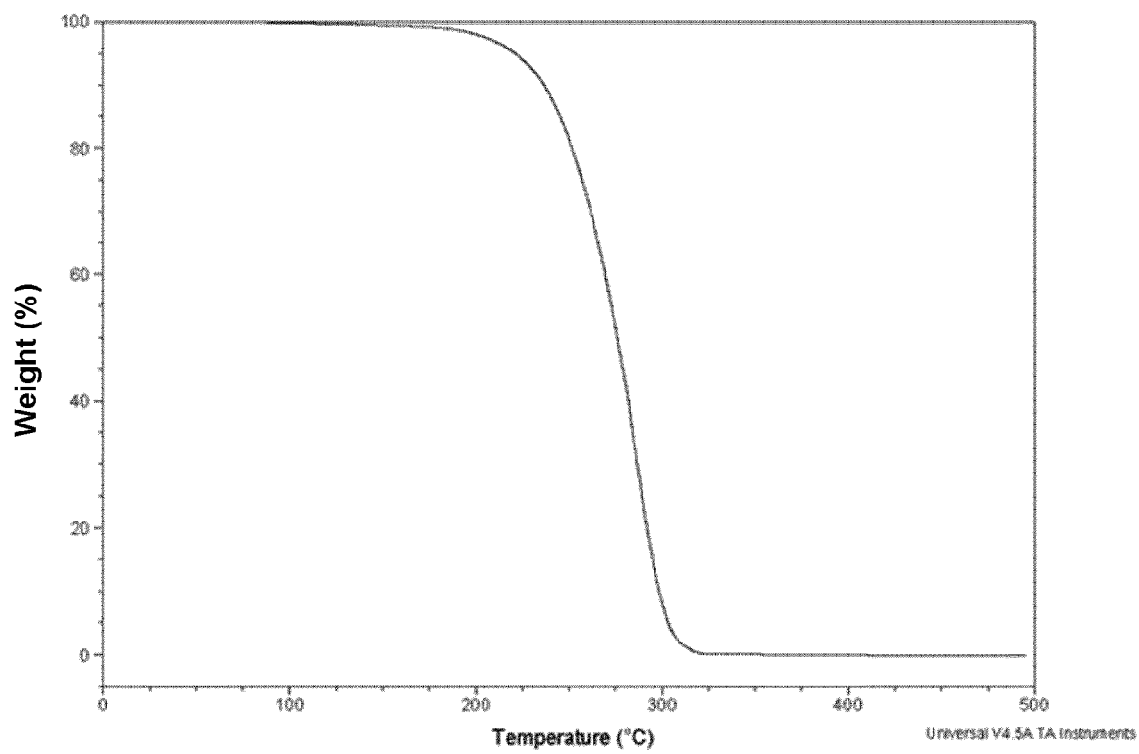
FIG. 3 illustrates the thermogravimetric analysis (TGA) of Example 2, La[Cp(CH$_2$)$_3$OCH$_3$][(C$_3$H$_7$)NC(CH$_3$)N(C$_3$H$_7$)]$_2$ ("(1B)-La-(3G)$_2$")

Characterization of Precursor (1B)-La-(3G)$_2$: 1H-NMR (C6D6, 400 MHZ): δ=6.56 (m, 2H), 6.39 (m, 2H), 3.49 (m, 4H), 3.14-3.18 (m, 5H), 2.69 (m, 2H), 1.70 (s, 6H), 1.68 (m, 2H), 1.20 (d, 24H). The TGA of this precursor is shown in FIG. 3. The TGA shows clean evaporation with low non-volatile residue.

Example 3: La[CpCH$_2$N(CH$_3$)$_2$][(C$_3$H$_7$)NC(H)N(C$_3$H$_7$)]$_2$ ("(2D)-La-(3C)$_2$")

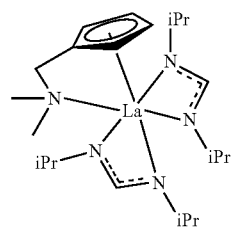

Inside a N$_2$ filled glovebox, a toluene solution of La[CpCH$_2$N(CH$_3$)$_2$]$_3$ (0.50 g, 1.0 mmol) was added to a heavy wall pressure vessel filled with La(FAMD)$_3$ (1.03 g, 2.00 mmol). The solution was heated at 100° C. under N$_2$ for 4 hours. The volatiles were removed under vacuum to afford an off-white solid. The crude material was further purified by sublimation at 130° C. and 130 m Torr to afford the final product as a white solid (0.85 g, 55% yield).

Figure 4:
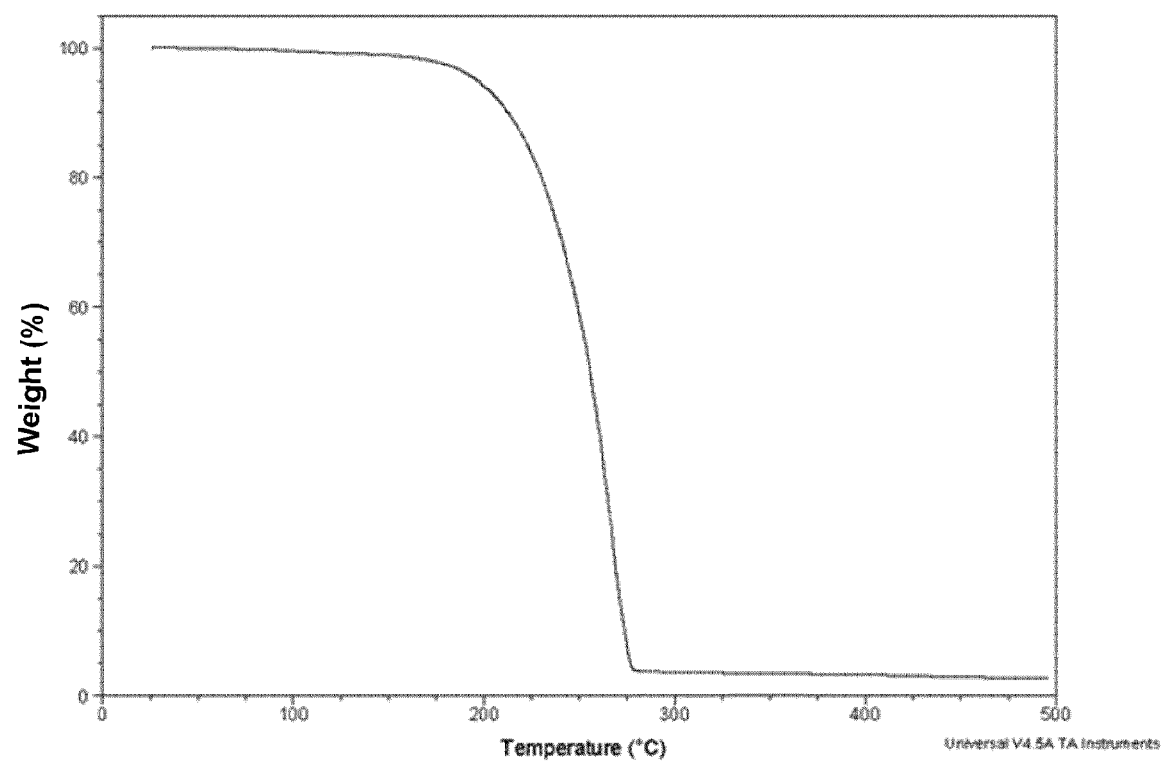
FIG. 4 illustrates the thermogravimetric analysis (TGA) of Example 3, La[CpCH$_2$N(CH$_3$)$_2$][(C$_3$H$_7$)NC(H)N(C$_3$H$_7$)]$_2$ ("(1B)-La-(3G)$_2$")

Characterization of Precursor (2D)-La-(3C)$_2$: 1H-NMR (C6D6, 400 MHZ): δ=8.18 (s, 2H), 6.51 (m, 2H), 6.43 (m, 2H), 3.42 (s, 2H), 3.05 (m, 4H), 2.06 (s, 6H), 1.17 (d, 24H). The TGA of this precursor is shown in FIG. 4. The TGA shows clean evaporation with low non-volatile residue.

Example 4: La[CpCH$_2$N(CH$_3$)$_2$][(C$_3$H$_7$)NC(CH$_3$)N(C$_3$H$_7$)]$_2$ ("(2D)-La-(3G)$_2$")

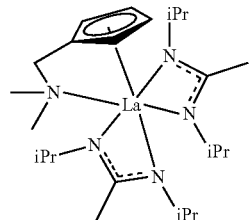

Inside a N$_2$ filled glovebox, a toluene solution of La[CpCH$_2$N(CH$_3$)$_2$]$_3$ (0.27 g, 0.53 mmol) was added to a heavy wall pressure vessel filled with La(iPr-AMD)$_3$ (0.60 g, 1.1 mmol). The solution was heated at 100°° C. under N$_2$ for 4 hours. The volatiles were removed under vacuum to afford a yellow solid. The crude material was further purified by sublimation at 150° C. and 130 mTorr to afford the final product as a white solid (0.49 g, 56% yield).

Figure 5:
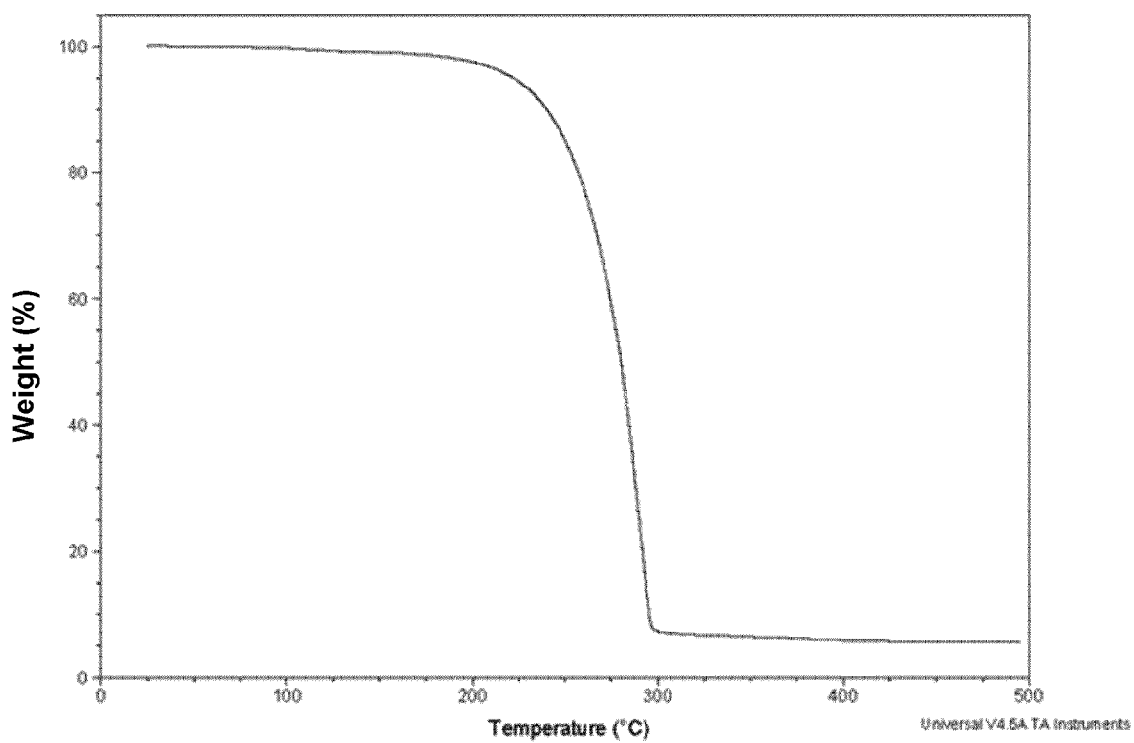
FIG. 5 illustrates the thermogravimetric analysis (TGA) of Example 4, La[CpCH$_2$N(CH$_3$)$_2$][(C$_3$H$_7$)NC(CH$_3$)N(C$_3$H$_7$)]$_2$ ("(2D)-La-(3G)$_2$")

Characterization of Precursor (2D)-La-(3G)$_2$: 1H-NMR (C6D6, 400 MHZ): δ=6.51 (m, 2H), 6.47 (m, 2H), 3.45 (m, 4H), 3.41 (s, 2H), 2.10 (s, 6H), 1.67 (s, 6H), 1.18 (d, 24H). The TGA of this precursor is shown in FIG. 5. The TGA shows clean evaporation with low non-volatile residue.

Example 5: La[Cp(CH$_2$)$_2$OCH$_3$][(C$_3$H$_7$)NC(H)N(C$_3$H$_7$)]$_2$ ("(1C)-La-(3C)$_2$")

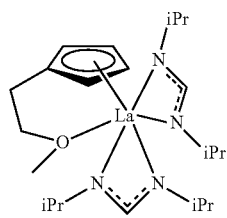

Inside an N$_2$ filled glovebox, a toluene solution of La[Cp(CH$_2$)$_2$OCH$_3$]$_3$ (0.36 g, 0.72 mmol) was added to La(FAMD)$_3$ (0.748 g, 1.44 mmol). The solution was heated at 100° C. under N$_2$ for 4 hours. The volatiles were removed under vacuum to afford a brown solid. The crude material was further purified by sublimation at 170° C. and 28 mTorr to afford the final product as a white solid (0.50 g, 45% yield).

Figure 6:
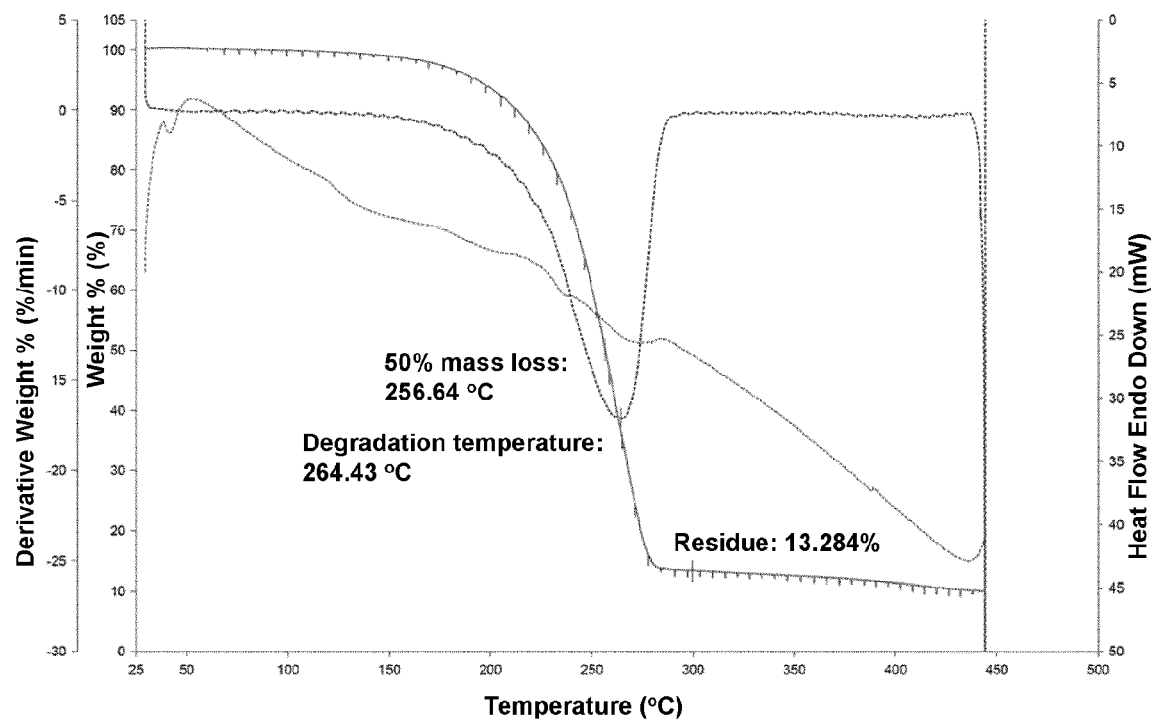
FIG. 6 illustrates the thermogravimetric analysis/DSC of Example 5, La[Cp(CH$_2$)$_2$OCH$_3$][(C$_3$H$_7$)NC(H)N(C$_3$H$_7$)]$_2$ ("(1C)-La-(3C)$_2$")

Characterization of Precursor (1C)-La-(3C)$_2$: 1H-NMR (C$_6$D$_6$, 400 MHZ): δ=1.18 (d, J=6.6 Hz, 24H, 8 —CH$_3$); 2.58 (t, J=5.8 Hz, 2H; —CH$_2$—); 3.10 (qq, J=6.5 Hz, 4H, —CHMe$_2$); 3.11 (s; 3H, —OMe); 3.47 (t, J=5.8 Hz, 2H; —CH$_2$-Cp); 6.36 (t, J=2.6 Hz, 2H, CpH$_2$); 6.47 (t, J=2.6 Hz, 2H, CpH$_2$). The TGA/DSC analysis of this precursor is shown in FIG. 6 (scan rate 10k/min).

Atomic Layer Deposition of Lanthanum Oxide Films With La[Cp(CH$_2$)$_3$OCH$_3$][(C$_3$H$_7$)NC(H)N(C$_3$H$_7$)]$_2$ ("(1B)-La-(3C)$_2$")

Atomic Premium CN-1 200 mm reactor was employed to demonstrate atomic layer deposition of lanthanum oxide films with the precursors of this invention. The precursor, (1B)-La -(3C)$_2$, was delivered from SS316 ampoule (container) kept at 160° C. (ampoule wall temperature). 50 sccm of argon carrier gas flow was used to deliver precursor vapor to the reactor chamber. Reactor chamber pressure was 1 torr. Si and SiO$_2$ substrates were used to deposit lanthanum oxide films. Lanthanum oxide film thickness was measured by ellipsometry and X-ray fluorescence (XRF) calibrated using cross-section SEM images of the deposited lanthanum oxide films.

Example 6: Precursor Thermal Decomposition Test on Si Wafer

Figure 7:
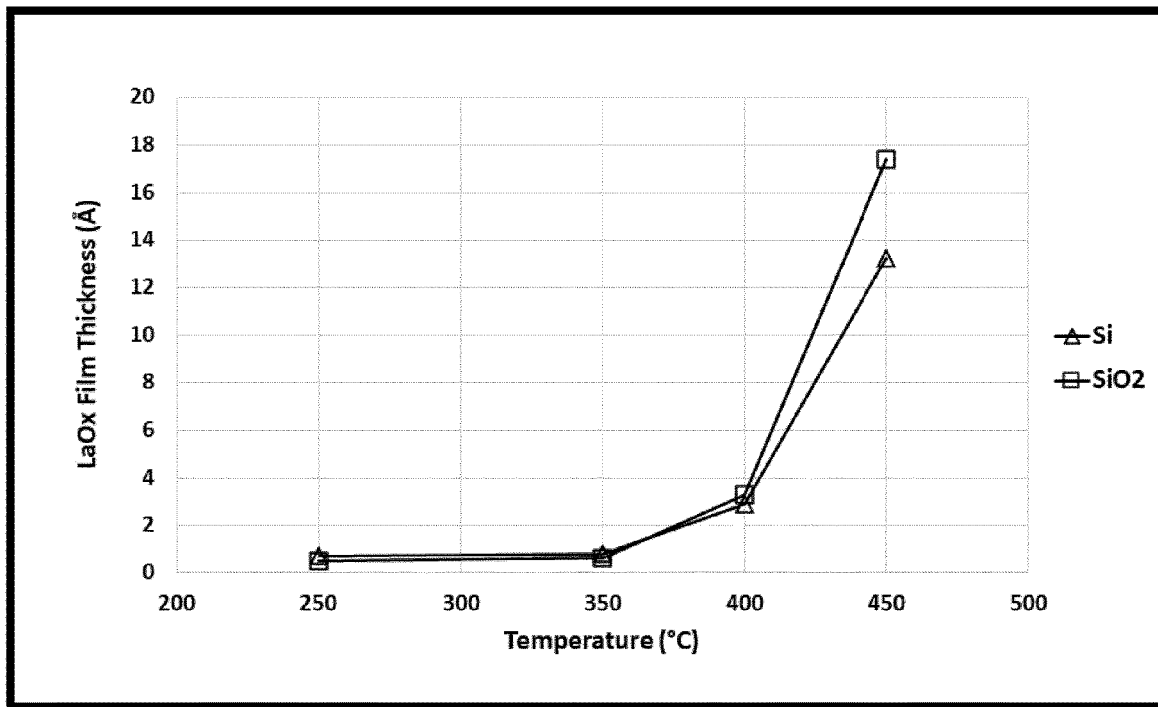
FIG. 7 illustrates the thermal decomposition of La[Cp(CH$_2$)$_3$OCH$_3$][(C$_3$H$_7$)NC(H)N(C$_3$H$_7$)]$_2$ ("(1B)-La-(3C)$_2$") precursor on Si and SiO$_2$ wafers.

In this experiment precursor vapors were delivered to the deposition chamber in a pulsed mode separated by argon purge. Pulse sequence was: 5 sec precursor pulse and 20 sec of argon purge. The total number of precursor/Ar purge cycles was 100. No oxidant pulse was used in this experiment to demonstrate good thermal stability of the precursor in the absence of the oxidant. Good thermal stability (lack of deposition in the absence of oxidant) is important precursor property for atomic layer deposition process. Wafer temperature was varied from 200° C. to 450° C. After the experiment lanthanum layer density on the surface was measured by X-Ray fluorescence analysis and is shown in FIG. 7. No lanthanum film was deposited in the absence of the oxidant up to at least 350°° C. suggesting that this precursor could be used for atomic layer deposition up to at least this wafer temperature.

Example 7: Precursor Saturation Behavior During Deposition Process

In this experiment lanthanum oxide films were deposited by atomic layer deposition method comprising the following steps:
a. providing Si or SiO$_2$ substrate in a reaction vessel
b. introducing into the reaction vessel (1B)-La-(3C)$_2$ precursor
c. purging the reaction vessel with argon
d. introducing into the reaction vessel ozone
e. purging the reaction vessel with argon
f. sequentially repeating steps b through e until a desired thickness of the transition metal-containing film is obtained.

Figure 8:
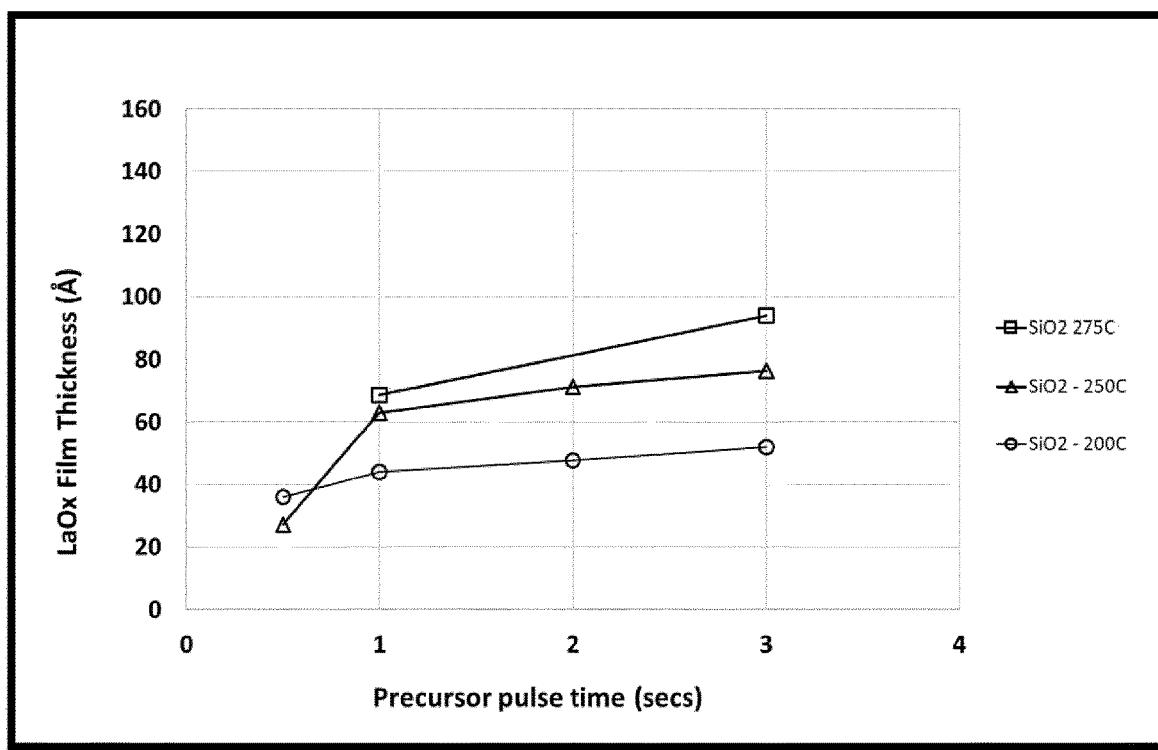
FIG. 8 illustrates the dependence of lanthanum oxide film thickness on SiO$_2$ wafer vs. pulse time of La[Cp(CH$_2$)$_3$OCH$_3$][(C$_3$H$_7$)NC(H)N(C$_3$H$_7$)]$_2$ ("(1B)-La-(3C)$_2$") precursor in an atomic layer deposition process.

Lanthanum precursor pulse varied from 1 to 3 seconds to demonstrate saturation behavior with increasing pulse time. Ar purge after precursor pulse was 10 sec, ozone pulse was 1 second, and Ar purge after precursor pulse was 30 sec. The number of ALD cycles was 100. The FIG. 8 shows very good saturation behavior at 200 and 250° C. and soft saturation at 275° C. wafer temperature. Saturation behavior is one of the key features of atomic layer deposition process.

Example 8: Film Thickness vs. Number of ALD Cycles

In this experiment lanthanum oxide films were deposited by atomic layer deposition method comprising the following steps:
a. providing Si or SiO$_2$ substrate in a reaction vessel
b. introducing into the reaction vessel (1B)-La-(3C)$_2$ precursor
c. purging the reaction vessel with argon
d. introducing into the reaction vessel ozone
e. purging the reaction vessel with argon
f. sequentially repeating steps b through e until a desired thickness of the transition metal-containing film is obtained.

Figure 9:
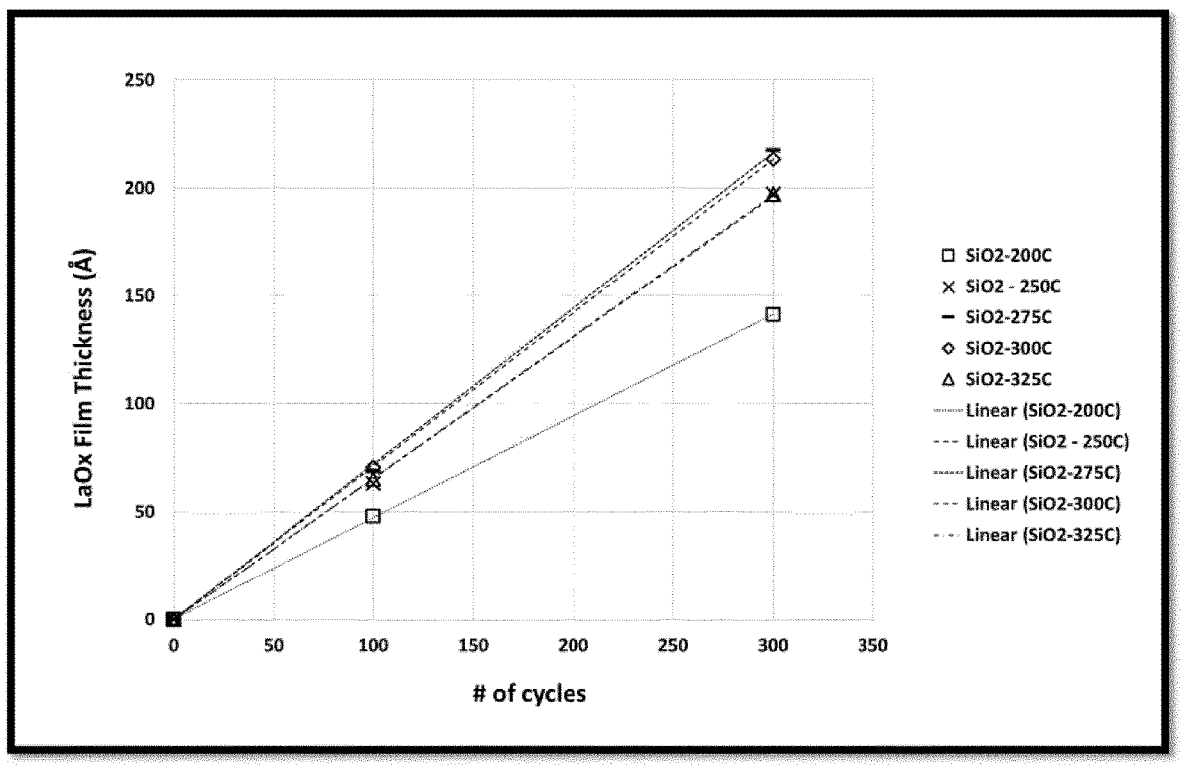
FIG. 9 illustrates the dependence of lanthanum oxide film thickness on SiO$_2$ wafer vs. the number of ALD cycles in atomic layer deposition process using La[Cp(CH$_2$)$_3$OCH$_3$][(C$_3$H$_7$)NC(H)N(C$_3$H$_7$)]$_2$ ("(1B)-La-(3C)$_2$") precursor.

Lanthanum precursor pulse was 1 second. Ar purge after precursor pulse was 10 sec, ozone pulse time was 1 second, and Ar purge after precursor pulse was 30 sec. The number of ALD cycles was 100 and 300 to demonstrate linear growth of lanthanum oxide films vs. the number of cycles. Wafer temperatures were 200° C., 250° C., 275° C., 300°° C. and 325° C. FIG. 9 shows linear growth of lanthanum oxide films with the number of cycles. Linear growth with increasing number of cycles is another feature of atomic layer deposition process. The table below shows no significant change in ALD deposition rate between 250° C. and 325° C. suggesting relatively broad ALD thermal window for the precursors of this invention.

| Temp, ° C. | LaOx Deposition Rate, Å/cycle | |
| --- | --- | --- |
| | on Si substrate | on SiO2 substrate |
| 200 | 0.46 | 0.47 |
| 250 | 0.67 | 0.67 |
| 275 | 0.72 | 0.74 |
| 300 | 0.73 | 0.71 |
| 325 | 0.68 | 0.66 |

Example 9: Deposition of Lanthanum Oxide Film

In this experiment lanthanum oxide films were deposited by atomic layer deposition method comprising the following steps:
a. providing Si or SiO$_2$ substrate in a reaction vessel
b. introducing into the reaction vessel (1B)-La-(3C)$_2$ precursor
c. purging the reaction vessel with argon
d. introducing into the reaction vessel ozone
e. purging the reaction vessel with argon
f. sequentially repeating steps b through e until a desired thickness of the transition metal-containing film is obtained.

Figure 10:
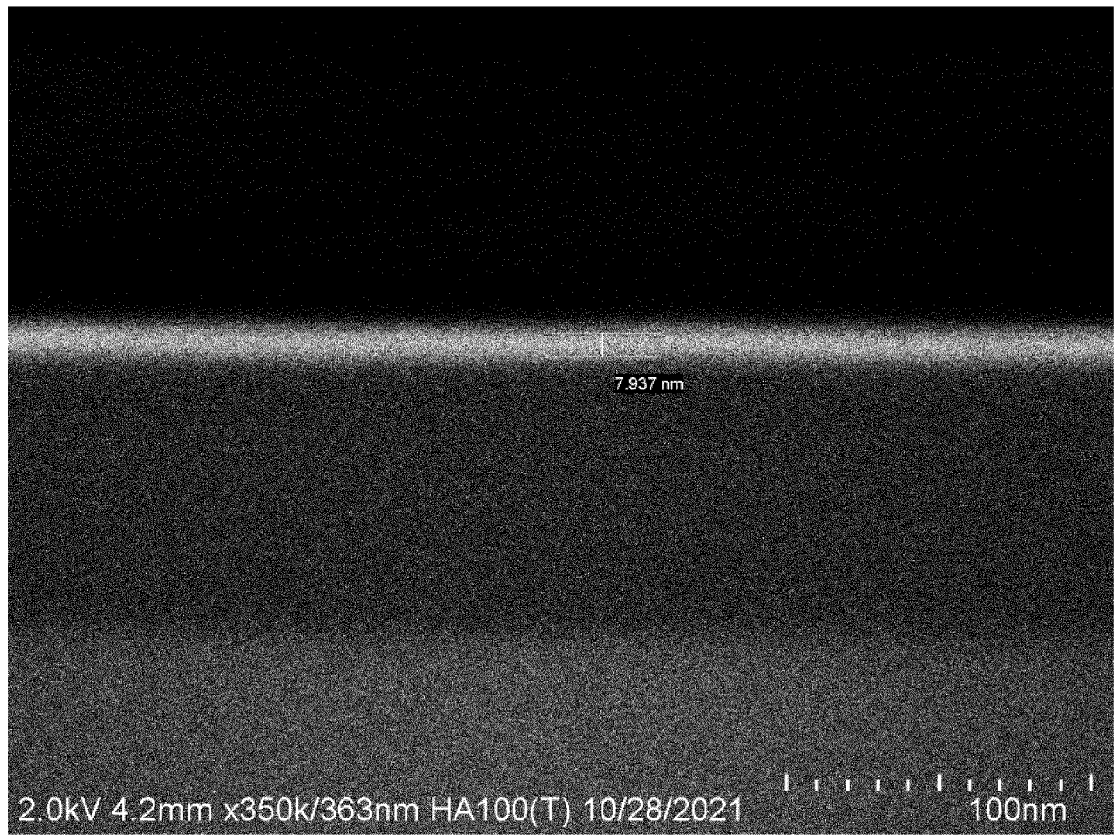
FIG. 10 illustrates cross section SEM image of lanthanum oxide film deposited on SiO$_2$ substrate using La[Cp(CH$_2$)$_3$OCH$_3$][(C$_3$H$_7$)NC(H)N(C$_3$H$_7$)]$_2$ ("(1B)-La-(3C)$_2$") precursor and the following process conditions: precursor pulse 2 sec; Ar purge 20 sec; ozone pulse 5 sec; Ar purge 20 sec; 100 pulses; wafer temperature 200°° C.
Figure 12:
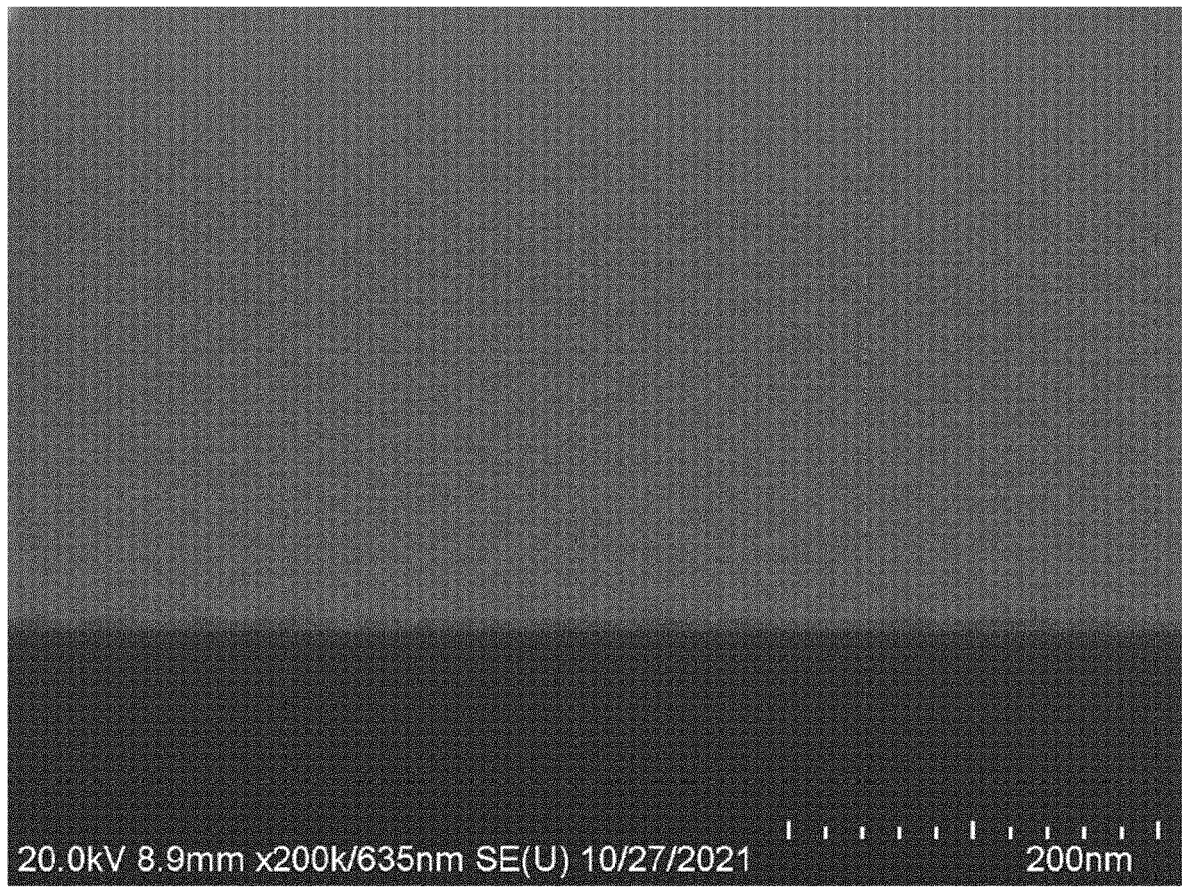
FIG. 12 illustrates top-down SEM image of lanthanum oxide film deposited on Si substrate using La[Cp(CH$_2$)$_3$OCH$_3$][(C$_3$H$_7$)NC(H)N(C$_3$H$_7$)]$_2$ ("(1B)-La-(3C)$_2$") precursor and the following process conditions: precursor pulse 2 sec; Ar purge 20 sec; ozone pulse 5 sec; Ar purge 20 sec; 100 pulses; wafer temperature 200° C.

Lanthanum precursor pulse was 2 seconds. Ar purge after precursor pulse was 20 sec, ozone pulse was 5 second, and Ar purge after precursor pulse was 20 sec. The number of ALD cycles was 100. Wafer temperature was 200°° C. FIG. 10 shows cross section SEM image of lanthanum oxide film deposited on SiO$_2$ substrate. FIG. 12 shows top-down SEM image of lanthanum oxide film deposited on Si substrate.

Example 10: Deposition of Lanthanum Oxide Film

In this experiment lanthanum oxide films were deposited by atomic layer deposition
method comprising the following steps:
a. providing Si or SiO$_2$ substrate in a reaction vessel
b. introducing into the reaction vessel (1B)-La-(3C)$_2$ precursor
c. purging the reaction vessel with argon
d. introducing into the reaction vessel ozone
e. purging the reaction vessel with argon
f. sequentially repeating steps b through e until a desired thickness of the transition metal-containing film is obtained.

Figure 11:
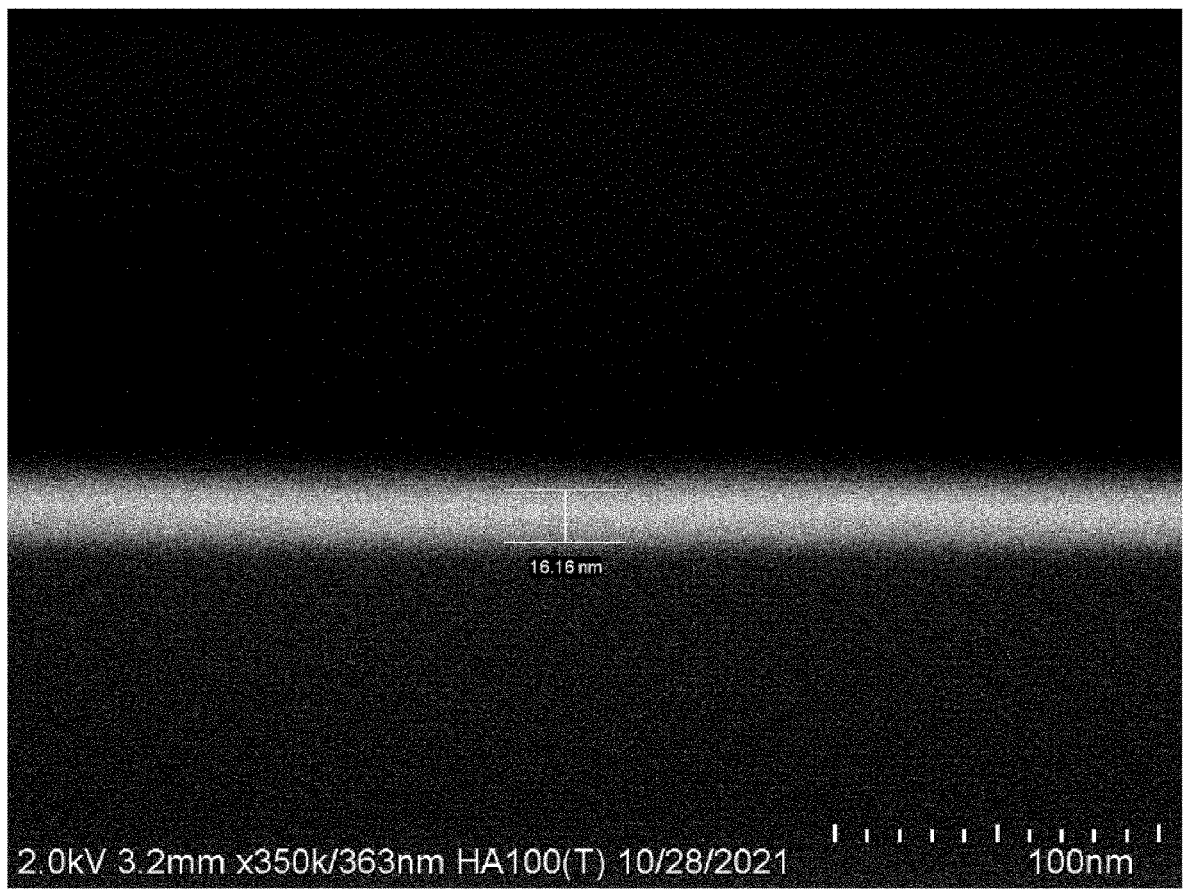
FIG. 11 illustrates cross section SEM image of lanthanum oxide film deposited on SiO$_2$ substrate using La[Cp(CH$_2$)$_3$OCH$_3$][(C$_3$H$_7$)NC(H)N(C$_3$H$_7$)]$_2$ ("(1B)-La-(3C)$_2$") precursor and the following process conditions: precursor pulse 2 sec; Ar purge 10 sec; ozone pulse 1 sec; Ar purge 30 sec; 300 pulses; wafer temperature 200° C.
Figure 13:
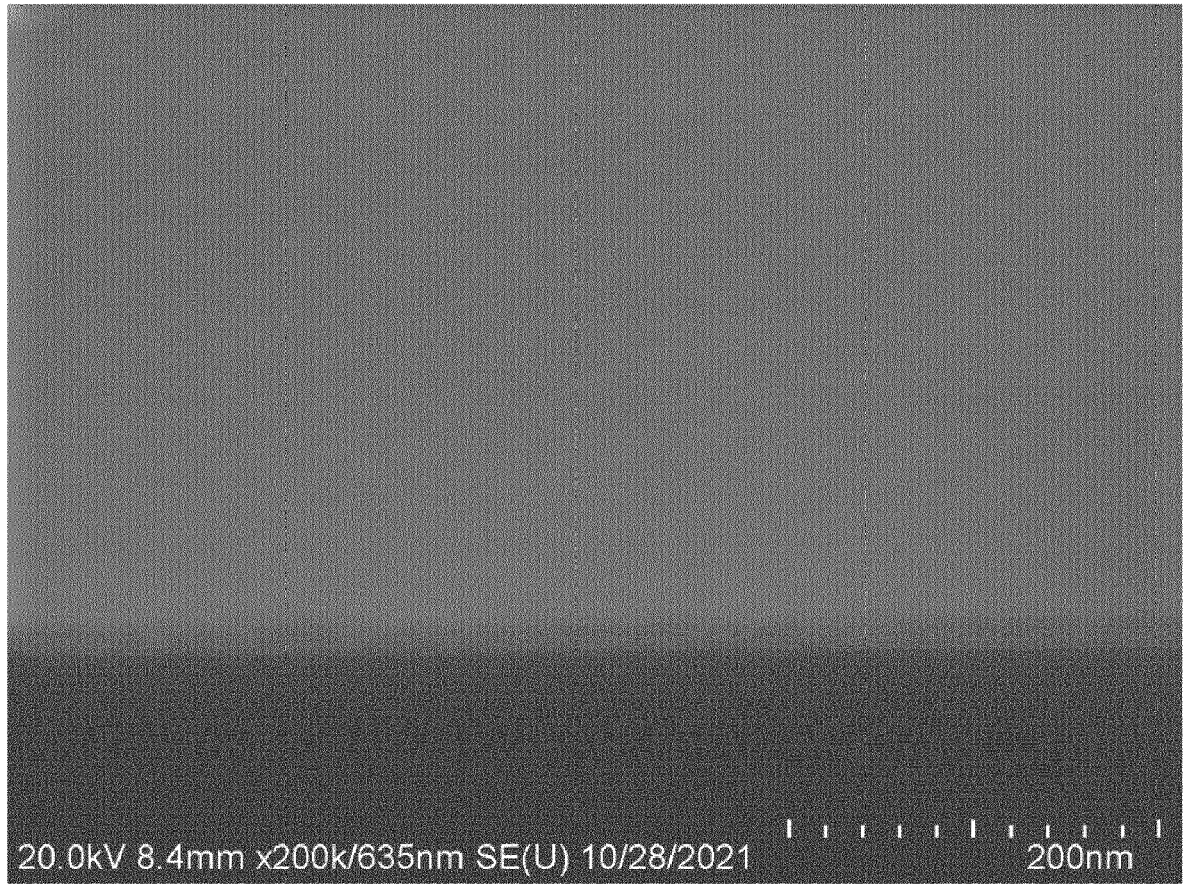
FIG. 13 illustrates top-down SEM image of lanthanum oxide film deposited on Si substrate using La[Cp(CH$_2$)$_3$OCH$_3$][(C$_3$H$_7$)NC(H)N(C$_3$H$_7$)]$_2$ ("(1B)-La-(3C)$_2$") precursor and the following process conditions: precursor pulse 2 sec; Ar purge 10 sec; ozone pulse 1 sec; Ar purge 30 sec; 300 pulses; wafer temperature 200° C.

Lanthanum precursor pulse was 2 seconds. Ar purge after precursor pulse was 10 seconds, ozone pulse was 1 second, and Ar purge after precursor pulse was 30 seconds. The number of ALD cycles was 300. Wafer temperature was 200° C. FIG. 11 shows cross section SEM image of lanthanum oxide film deposited on SiO$_2$ substrate. FIG. 13 shows top-down SEM image of lanthanum oxide film deposited on Si substrate.

The foregoing description is intended primarily for purposes of illustration. Although the disclosed and claimed subject matter has been shown and described with respect to an exemplary embodiment thereof, it should be understood by those skilled in the art that the foregoing and various other changes, omissions, and additions in the form and detail thereof may be made therein without departing from the spirit and scope of the disclosed and claimed subject matter.

What is claimed is:

1. A precursor having Formula I or Formula II:

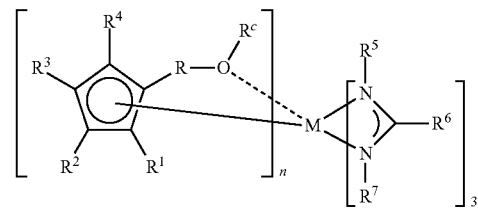

Formula I

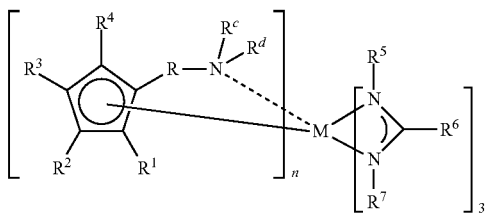

Formula II wherein
 i. M is one of La, Sc, Y, Ce, Pr, Nd, Pm, Sm, Eu, Gd, Tb, Dy, Ho, Er, Tm, Yb and Lu;
 ii. $R^1$, $R^2$, $R^3$, $R^4$, $R^5$, $R^6$ and $R^7$ are each independently selected from H, an unsubstituted linear $C_1$-$C_6$ alkyl group, a linear $C_1$-$C_6$ alkyl group substituted with a halogen, a linear $C_1$-$C_6$ alkyl group substituted with an amino group, an unsubstituted branched $C_3$-$C_6$ alkyl group, a branched $C_3$-$C_6$ alkyl group substituted with a halogen, a branched $C_3$-$C_6$ alkyl group substituted with an amino group and —Si(CH$_3$)$_3$;
 iii. R is a linear or branched $C_1$-$C_6$ alkylene;
 iv. $R^c$ and $R^d$ are each independently selected from H, and an unsubstituted linear $C_1$-$C_3$ alkyl group; and
 v. n=1 or 2.

2. The precursor of claim 1, wherein M is La.

3. The precursor of claim 1, wherein $R^1$, $R^2$, $R^3$, $R^4$ are each H and $R^5$, $R^6$ and $R^7$ are each independently selected from H, an unsubstituted linear $C_1$-$C_4$ alkyl group, an unsubstituted branched $C_3$-$C_6$ alkyl group and —Si(Me)$_3$.

4. The precursor of claim 1, wherein $R^1$, $R^2$, $R^3$, $R^4$, $R^5$, $R^6$ and $R^7$ are each independently selected from H, an unsubstituted linear $C_1$-$C_4$ linear alkyl group, an unsubstituted branched $C_3$-$C_6$ alkyl group and —Si(Me)$_3$.

5. The precursor of claim 1, wherein one or more of $R^5$, $R^6$ and $R^7$ is an isopropyl group.

6. The precursor of claim 1, wherein two or more of $R^5$, $R^6$ and $R^7$ is an isopropyl group.

7. The precursor of claim 1, wherein $R^6$ is H and $R^5$, $R^7$ are independently an unsubstituted linear $C_1$-$C_4$ alkyl group, an unsubstituted branched $C_3$-$C_6$ alkyl group and —Si(Me)$_3$.

8. The precursor of claim 1, wherein n=1.

9. The precursor of claim 1, wherein n=2.

10. The precursor of claim 1, wherein R is selected from the group of —(CH$_2$)—, —(CH$_2$)$_2$—, —(CH$_2$)$_3$, —(CH$_2$)$_4$—, —C(CH$_3$)$_2$—, —CH(CH$_3$)—, —C(CH$_3$)$_2$CH$_2$—, —CH(CH$_3$)CH$_2$—, —C(CH$_3$)$_2$(CH$_2$)$_2$— and —CH(CH$_3$)(CH$_2$)$_2$—.

11. The precursor of claim 1, wherein $R^c$ is —CH$_3$.

12. The precursor of claim 1, wherein $R^c$ is —CH$_2$CH$_3$.

13. The precursor of claim 1, wherein $R^c$ is —CH$_2$CH$_2$CH$_3$.

14. The precursor of claim 1, wherein at least one of $R^c$ and $R^d$ is —CH$_3$.

15. The precursor of claim 1, wherein at least one of $R^c$ and $R^d$ is —CH$_2$CH$_3$.

16. The precursor of claim 1, wherein each of $R^c$ and $R^d$ is —CH$_3$.

17. The precursor of claim 1, wherein each of $R^c$ and $R^d$ is —CH$_2$CH$_3$.

18. The precursor of claim 1, wherein the precursor comprises a structure of Formula 1.

19. The precursor of claim 1, wherein the precursor comprises a structure of Formula 2.

20. The precursor of claim 1 having the following structure:

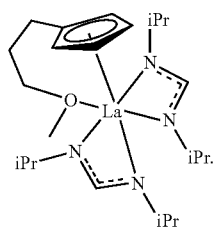

21. The precursor of claim 1 having the following structure:

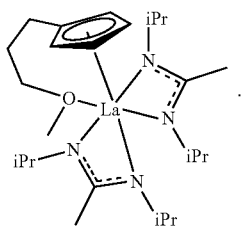

22. The precursor of claim 1 having the following structure:

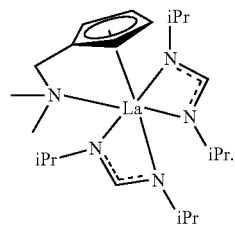

23. The precursor of claim 1 having the following structure:

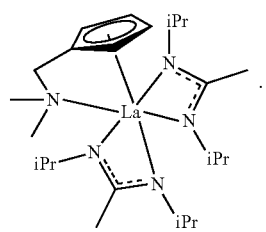

24. The precursor of claim 1 having the following structure:

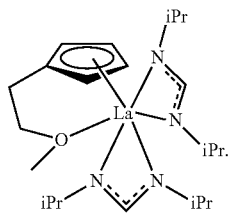

25. A method for forming a transition metal-containing film on at least one surface of a substrate comprising:
   a. providing the at least one surface of the substrate in a reaction vessel;
   b. forming a transition metal-containing film on the at least one surface by a deposition process chosen from a chemical vapor deposition (CVD) process and an atomic layer deposition (ALD) process using the precursor of claim 1 as a metal source compound for the deposition process.

* * * * *